(12) United States Patent
Lin et al.

(10) Patent No.: US 12,400,926 B2
(45) Date of Patent: Aug. 26, 2025

(54) SEMICONDUCTOR DEVICE AND METHOD OF MANUFACTURE

(71) Applicant: Taiwan Semiconductor Manufacturing Company, Hsinchu (TW)

(72) Inventors: You-Ru Lin, New Taipei (TW); Sheng Kai Yeh, Taichung (TW); Jen-Yuan Chang, Hsinchu (TW); Chi-Yuan Shih, Zhubei (TW); Chia-Ming Hung, Taipei (TW); Hsiang-Fu Chen, Zhubei (TW); Shih-Fen Huang, Jhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 479 days.

(21) Appl. No.: 17/752,976

(22) Filed: May 25, 2022

(65) Prior Publication Data
US 2023/0386948 A1    Nov. 30, 2023

(51) Int. Cl.
*H01L 23/31* (2006.01)
*B81C 1/00* (2006.01)

(52) U.S. Cl.
CPC ...... *H01L 23/3114* (2013.01); *B81C 1/00261* (2013.01); *B81C 2203/036* (2013.01); *B81C 2203/0714* (2013.01)

(58) Field of Classification Search
CPC ............. H01L 23/3114; B81C 1/00214; B81C 1/00261; B81C 2203/036; B81C 2203/0714; B81B 2201/0271; B81B 2203/0127
See application file for complete search history.

(56) References Cited

U.S. PATENT DOCUMENTS

| | | | | |
|---|---|---|---|---|
| 11,444,068 | B2 * | 9/2022 | Song | H01L 24/80 |
| 11,862,618 | B2 * | 1/2024 | Lee | H01L 23/5226 |
| 12,009,303 | B2 * | 6/2024 | Kim | H01L 23/36 |
| 12,057,383 | B2 * | 8/2024 | Haba | H01L 24/32 |
| 2008/0061419 | A1 | 3/2008 | Enquist et al. | |

(Continued)

FOREIGN PATENT DOCUMENTS

| | | |
|---|---|---|
| CN | 106365115 B | 8/2019 |
| TW | I560135 B | 12/2016 |

*Primary Examiner* — Telly D Green
(74) *Attorney, Agent, or Firm* — Lippes Mathias LLP

(57) ABSTRACT

A semiconductor device and method of forming such a device includes a MEMS component including one or more MEMS pixels and having a MEMS membrane substrate and a MEMS sidewall. The semiconductor device includes an analog circuit component bonded to the MEMS component, and which includes at least one analog CMOS component within an analog circuit insulative layer, and an analog circuit component substrate. The semiconductor device includes an HPC component bonded to the analog circuit component substrate. The HPC component includes at least one HPC metal component disposed within an HPC insulative layer, at least one bond pad, at least one bond pad via connecting the at least one bond pad and the at least one HPC metal component, and an HPC substrate. Additionally, the semiconductor device includes a DTC component bonded to the HPC substrate, and which includes a DTC die disposed in a DTC substrate.

20 Claims, 26 Drawing Sheets

(56) References Cited

U.S. PATENT DOCUMENTS

| | | | |
|---|---|---|---|
| 2008/0081458 A1* | 4/2008 | Lin | H01L 24/11 |
| | | | 438/620 |
| 2010/0093259 A1* | 4/2010 | Lee | B24B 49/12 |
| | | | 451/6 |
| 2013/0168740 A1 | 7/2013 | Chen | |
| 2017/0053907 A1 | 2/2017 | Huang et al. | |
| 2021/0155472 A1 | 5/2021 | Tocchio et al. | |
| 2021/0351135 A1 | 11/2021 | Or-Bach et al. | |
| 2022/0020735 A1* | 1/2022 | Song | H01L 24/80 |
| 2022/0130761 A1* | 4/2022 | Kim | H01L 23/5226 |
| 2022/0165721 A1* | 5/2022 | Lee | H01L 24/08 |
| 2022/0216185 A1* | 7/2022 | Kao | H01L 23/53228 |
| 2023/0260894 A1* | 8/2023 | Hu | H10B 63/80 |
| | | | 257/690 |

\* cited by examiner

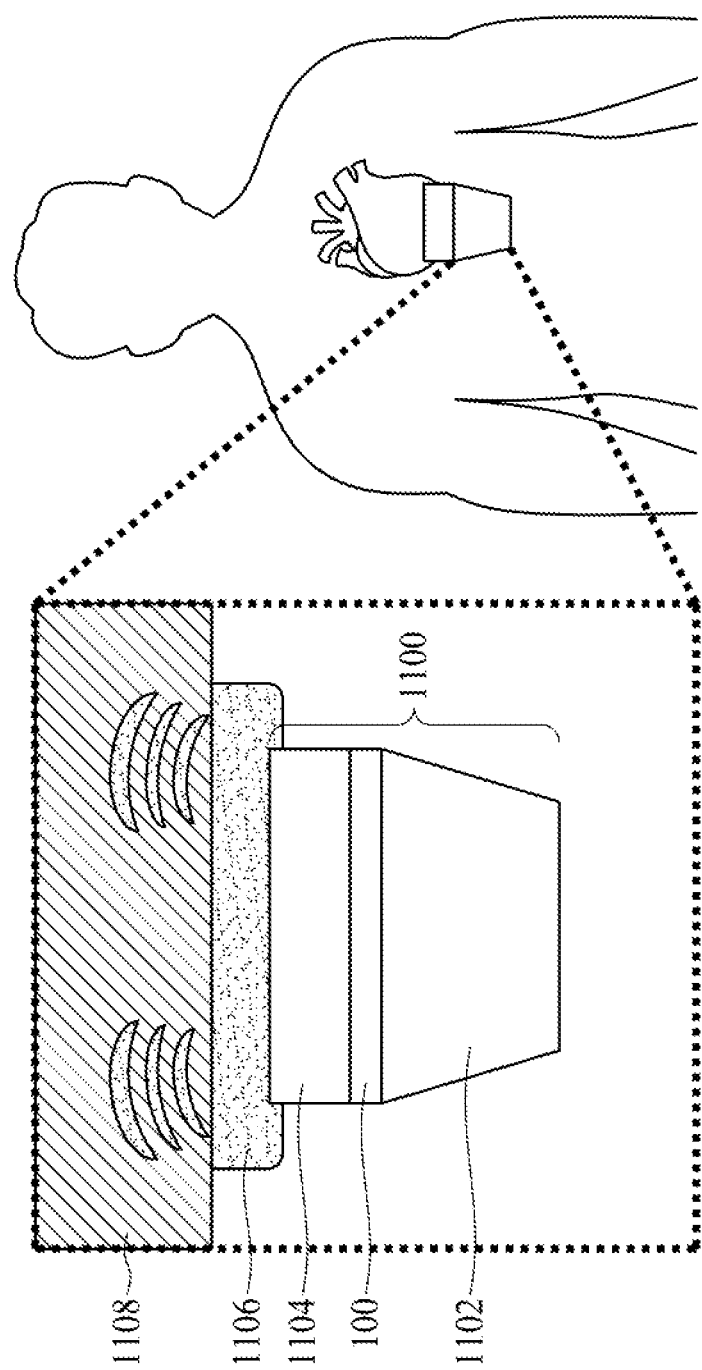

SEMICONDUCTOR DEVICE AND METHOD OF MANUFACTURE

BACKGROUND

Micro-electro-mechanical systems (MEMS) is a technology that utilizes miniature mechanical and electromechanical elements (e.g., devices or structures) on an integrated circuit substrate. MEMS devices may range from relatively simple structures with no moving elements, to complex electro-mechanical systems utilizing a variety of moving elements under the control of an integrated microelectronic controller. The devices or structures that are used in MEMS include microsensors, micro-actuators, microelectronics, and microstructures. MEMS devices may be used in a wide range of applications, including, for example and without limitation, motion sensors, pressure sensors, inertial sensors, micro-fluidic devices (e.g., valves, pumps, nozzle controls), optical devices, imaging devices (e.g., micromachined ultrasonic transducers (MUT's)), capacitive ultrasound transducers (CMUT), and the like.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 11 is an example implementation of the semiconductor device of FIG. 10.

DETAILED DESCRIPTION

Figure 1:
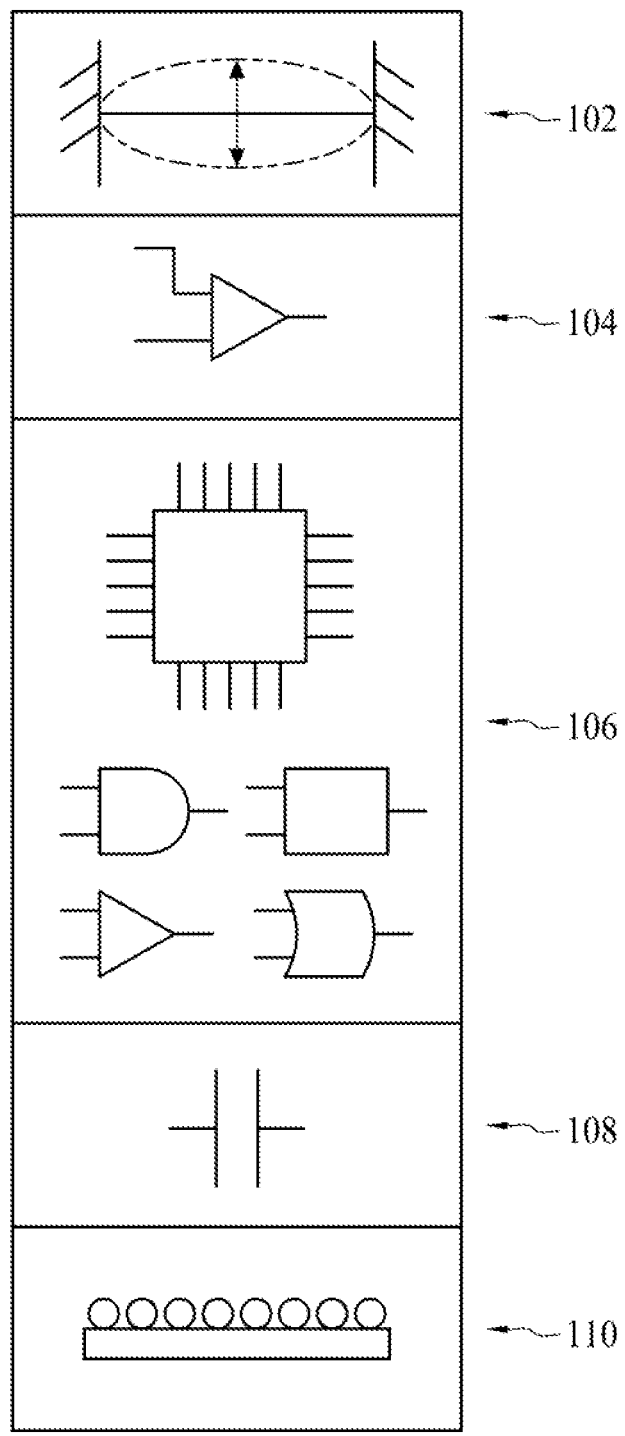
FIG. 1 is a block diagram of a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "about" can be used to include any numerical value that can vary without changing the basic function of that value. When used with a range, "about" also discloses the range defined by the absolute values of the two endpoints, e.g., "about 2 to about 4" also discloses the range "from 2 to 4." The term "about" may refer to plus or minus 10% of the indicated number.

In some embodiments, a semiconductor device (e.g., integrated chip) comprises a microelectromechanical systems (MEMS) device. The MEMS device comprises a cavity and a movable membrane. The configuration (e.g., structural configuration) of the MEMS device is dependent on the type of MEMS device. The present disclosure discusses structures and fabrication methods of a capacitive micromachined ultrasonic transducer (CMUT). The CMUT device is widely used in high-resolution applications, e.g., medical diagnostics, imaging, sensors, etc., as well as air-coupled non-destructive evaluation, ultrasonic flow meters for narrow gas pipelines, microphones with RF detection, Lamb wave devices, smart microfluidic channels, and the like. Current production of CMUTs utilizes a bottom electrode covered by a dielectric film, with the movable membrane spaced apart from the bottom electrode by a gap (thus, the cavity of the CMUT is located between the movable membrane and the bottom electrode). The movable membrane carries a top electrode, so that movement of the membrane in response to sonic waves creates a variable capacitance between the bottom and top electrodes, thus providing an acoustic transducer. (Conversely, an AC electrical signal applied across the top and bottom electrodes can cause the membrane to oscillate and generate an acoustic wave).

Use of such MEMS devices in ultrasound equipment involves an array of CMUTs controlled by a central processing unit, generally in communication with the CMUT array via a communications cable that supplies control signals, power, and receives output from the array. The central processing unit then processes the returned signals to output a visual representation of an object on an associated display, e.g., inside of a food container, pregnancy ultrasounds, luggage contents, etc. These kiosk-like pieces of equipment require remote processing capabilities and are generally bulky, requiring frames and structures to allow movement of the system. Further, the costs associated with this system include both the central processing unit (generally implemented as a desktop, laptop, or the like, computing system), the frame, the display, and the ultrasound wand (i.e., the wired component that contains the CMUT array), may be substantial.

Turning now to FIG. 1, there is shown a representative block diagram of a semiconductor device 100 in accordance with one embodiment of the subject application. As shown in FIG. 1, the semiconductor device 100 includes a MEMS component 102, an analog circuit component 104, a high performance chip (HPC) component 106, a deep trench capacitor (DTC) component 108, and a printed circuit board component 110. The three-dimensional vertical integration of the semiconductor device 100 is illustrated in FIG. 1 for exemplary purposes and is intended solely to provide an overview of the semiconductor device 100 in accordance with on embodiment of the subject application.

In some embodiments, the MEMS component 102 may comprise, for example and without limitation, CMUT devices, PMUT devices, fluidic devices, accelerometers, or the like. The analog circuit component 104 may comprise various analog signal devices, analog electronic devices, or the like. Such example components of the analog circuit component 104 include, for example and without limitation, high voltage (HV) pulsers, transimpedance amplifiers (TIA), metal insulator metal (MIM), and the like. The HPC component 106 may be implemented with a variety of devices for processing, including, for example and without limitation, advanced transistors (e.g., FinFET, gate all-around (GAA) FET, etc.), embedded memory (e.g., resistive RAM, magnetoresistive RAM, phase change memory (PCRAM), etc.), and the like. It will be appreciated that such a HPC component 106 may be referenced herein as a microprocessor component configured to control operations of the components 102-110 of the semiconductor device 100 in accordance with varying embodiments contemplated herein.

The DTC component 108 may comprise one or more deep trench capacitors used in the operation of the semiconductor device 100. As indicated in FIG. 1, the semiconductor device 100 also utilizes a printed circuit board component 110 configured to allow integration of the semiconductor device 100 with the final system implementation, e.g., an ultrasound system, display, wand, etc. The skilled artisan will appreciate that the printed circuit board component 110 may provide mechanical (e.g., structural) support, as well as provide electrical routing of the semiconductor device 100 to other devices. The interaction and interconnection of the components 102-110 will be better understood in conjunction with the detailed cross-sectional illustrations provided in FIGS. 2A-2I, discussed below.

Referring now to FIGS. 2A-2I, there are shown partial cross-sectional views of various stages of the manufacturing of the semiconductor device 100. It will be appreciated that the semiconductor device 100 illustrated in FIGS. 2A-2I is represented as a three-dimensional MEMS package module that comprises a plurality of stacked components, e.g., MEMS devices, analog circuits, microprocessor(s), power components, and circuit board/substrate. It will be understood that the illustration of FIGS. 2A-2I are intended as an example implementation of the system and methods described hereinafter.

In particular, it will be understood that FIGS. 2A-2I illustrate manufacturing stages of the various components (i.e., a MEMS component 102, an analog circuit component 104, a high performance chip (HPC) component 106, a deep trench capacitor (DTC) component 108, and a circuit board component 110) used in assembling the semiconductor device 100 of FIGS. 2A-2I. Further, it will be appreciated that the various components 102-110 may be fabricated parallelly and independently without specific sequence of manufacturing. That is, the HPC component 106 may be fabricated in a different fab unit and prior to manufacture of the MEMS component 102, or vice versa. Accordingly, the skilled artisan will appreciate that the illustrations in FIGS. 2A-2I are intended as non-exhaustive example depictions of various stages of manufacture/formation of the components 102-110 utilized in the semiconductor device 100.

Figure 2A:
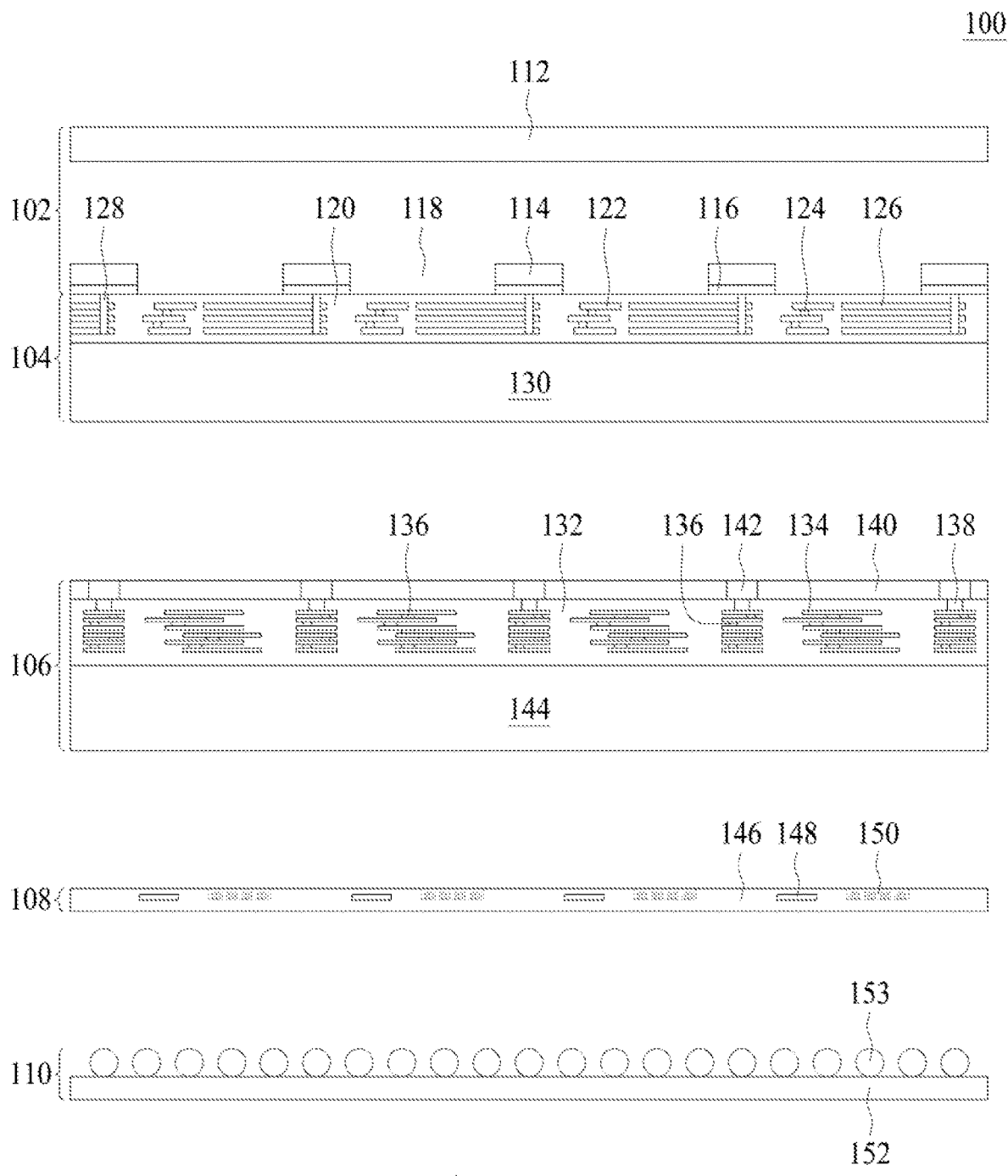
FIGS. 2A-2I are cross-sectional views of stages of manufacturing a semiconductor device in accordance with some embodiments.

Turning now to FIG. 2A, there is shown a first cross-sectional view of the various components of the semiconductor device 100 during an initial stage of fabrication. As indicated above, each of the components 102-110 may be manufactured separately and independently prior to final formation of the semiconductor device 100. In FIG. 2A, the MEMS component 102 is depicted as comprising a MEMS membrane substrate 112 and a MEMS sidewall component 114. As will be appreciated, the MEMS membrane substrate 112 may be constructed of Si, SiO2, SiN, SiON, or the like, and include a dielectric film coating. The MEMS sidewall component 114 may be constructed of similar materials as that of the MEMS membrane substrate 112, as will be appreciated by the skilled artisan. In some embodiments, the MEMS sidewall component 114 may be initially formed as a single layer of material on the analog circuit component 104, and patterned to form cavities 118 between the MEMS sidewall components 114.

In other embodiments, the cavities 118 and MEMS sidewall components 114 may be patterned from the MEMS membrane substrate 112. As illustrated in FIG. 1A, the MEMS sidewall components 114 are formed on a MEMS/analog bonding area 116, disposed an analog circuit insulative layer 120 (of the analog circuit component 104). Suitable bonding for the bonding area 116 may include, for example and without limitation, eutectic bonding, fusion bonding, hybrid bonding, or the like. In addition to the foregoing, when the MEMS component 102 is implemented as a CMUT or PMUT, the skilled artisan will appreciate that the MEMS component 102 further includes one or more bottom or sensing electrodes (not shown), positioned within the cavity 118 for actuation of the MEMS membrane substrate 112 during operations of the semiconductor device 100. In accordance with varying embodiments contemplated herein, the aforementioned bottom electrode may comprise, for example and without limitation titanium (Ti) or other metal (e.g., Al, Cu, AlCu, Ag, Au, W, or the like), a metal nitride (e.g., titanium nitride (TiN), another conductive material, or suitable combinations thereof. The bottom/sensing electrodes may be deposited by, for example and without limitation, CVD, PVD, ALD, electroless plating, electrochemical plating, sputtering, ion metal plasma, another deposition process, or any suitable combination thereof.

The illustration of the semiconductor device 100 of FIG. 2A further includes an analog circuit component 104, positioned between the MEMS component 102 and the HPC component 106. As shown in FIG. 2A, the analog circuit component 104, at this stage of manufacturing, includes an analog circuit insulative layer 120 positioned on an analog circuit substrate 130. As indicated above, the analog circuit component 104 may include various analog components (e.g., HV pulsers, TIA, MIM, etc.). FIG. 2A illustrates analog complimentary metal oxide semiconductor (CMOS) components 122, analog CMOS component vias 124, and analog electrical routing components 126 (configured to function as routing for the analog CMOS components 122).

A fusion/eutectic/hybrid bonding area 128 is also illustrated in FIG. 2A associated with the MEMS/analog bonding area 116.

The semiconductor device 100 of FIG. 2A further includes an HPC component 106 that includes an HPC insulative layer 132 (e.g., a CMOS oxide material) formed on an HPC substrate 144. As shown in FIG. 2A, the HPC component 106 includes HPC metal components 134 and HPC metal component vias 136. In accordance with some embodiments, the HPC metal components 134 may be implemented as integrated circuit components, including, for example and without limitation active components (e.g., transistors (the aforementioned FinFET, GAA, etc.), passive components (e.g., capacitors, inductors, resistors, and the like), or combinations thereof. In such embodiments, the HPC metal component vias 136 may be implemented to interconnect the HPC metal components 134. As will be appreciated, the integration of the HPC component 106 in the semiconductor device 100 integrates advanced CMOS processing capabilities to provide high computing MEMS actuating and sensing advantages. The HPC component 106 may further include a bond pad via 138 for electrical routing to connect the analog component 104 with the HPC component 106 through a bond pad 142. The bond pad 142 is positioned within a conjunction insulation layer 140 formed on the HPC substrate 144, as illustrated in FIG. 2A. Additional details of the bond pad via 138 and the bond pad 142 are shown in FIG. 3 below.

Figure 3:
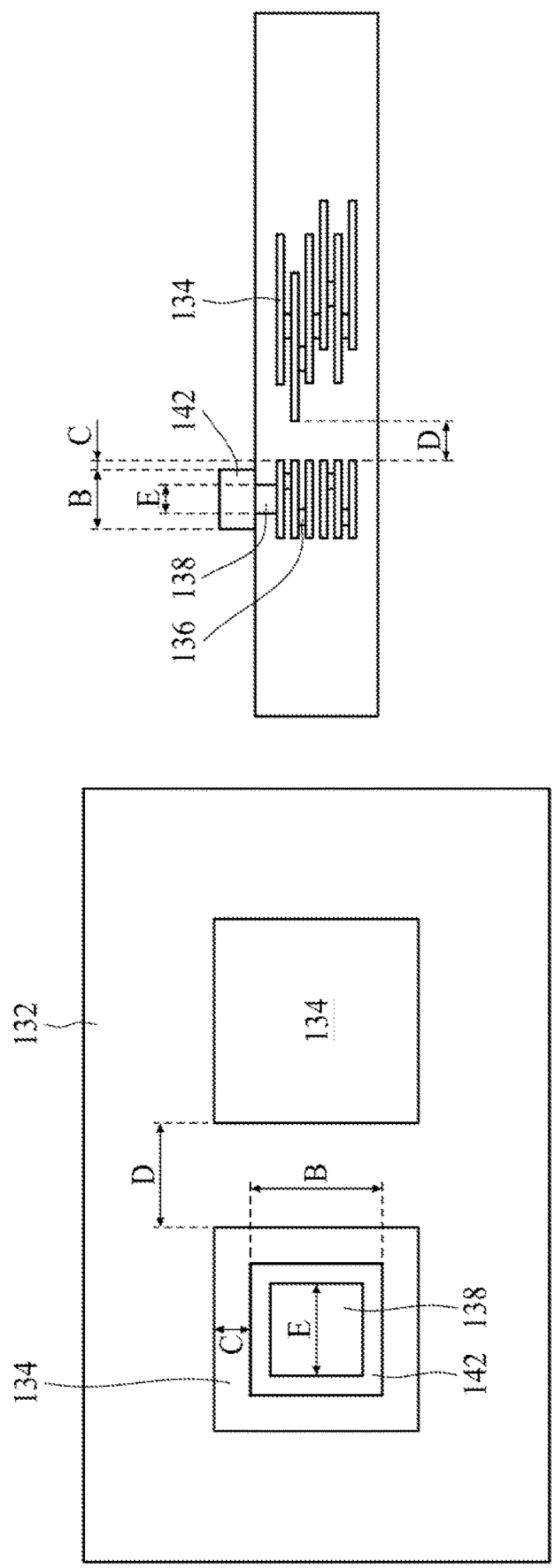
FIG. 3 is a top view and side view of a bond pad, bond pad via, and HPC metal components in accordance with some embodiments.

In FIG. 3, there is shown a top view and side view of the ordered formation of the bond pad 142, the bond pad via 138 and positioning thereof relative to the HPC metal components 134 within the HPC insulative layer 132. As illustrated in FIG. 3, the bond pad via 138 extends through the bond pad 142, enabling electrical connectivity between the analog circuit component 102 and the HPC metal component 134. As shown in FIG. 3, stacking of the HPC metal components 134 (i.e., CMOS metals) below the bond pad 142 provides structural support to prevent cracking in the HPC insulative layer 132 (i.e., the CMOX oxide material), as well as providing electromagnetic interference (EMI) shielding. In addition, as shown in FIG. 3, the HPC metal components 134 adjacent to the bond pad 142 may be separated by a distance "D" from the other HPC metal components 134 (shown at 300) in the cross-sectional view, so as to prevent cracking in the HPC insulative layer 132. In accordance with some embodiments, the distance "D" should be greater than 1 um, and within the range of about 1 um~5 um. The length "E" of the bond pad via 142 should be greater than 0.6 um, and within the range of about 0.6 um~6 um. In some embodiments, as illustrated in FIG. 3, the bond pad 142 should be situated on the underlying HPC metal component 134, with a distance "C" from the outside of the bond pad 142 to the edge of the HPC metal component 134 greater than 0.1 um, and within the range of about 0.1 um~3 um. In such an embodiment, the bond pad 142 may have a length "B" of about 2.4 um, and within the range of 2.4 um~4.4 um.

Returning to FIG. 2A, the DTC component 108 of the semiconductor device 100 includes a DTC carrier substrate 146, one or more DTC carrier substrate metal routings 148, and one or more DTC dies 150 (e.g., deep trench capacitors). In some embodiments, the DTC dies 150 include a plurality of deep trench capacitors to add capacitance to various integrated circuits, e.g., the various devices of the HPC component 106. The DTC component 108, as shown in FIG. 2A, is positioned between the HPC component 106 and the circuit board component 110. The circuit board component 110 of FIG. 2A is depicted as including a circuit board 152 and one or more solder balls 153. According to some embodiments, the circuit board component 110 is configured to provide a final electrical connection platform for the semiconductor device 100, and may be implemented as a printed circuit board (PCB), or the like.

Figure 2B:
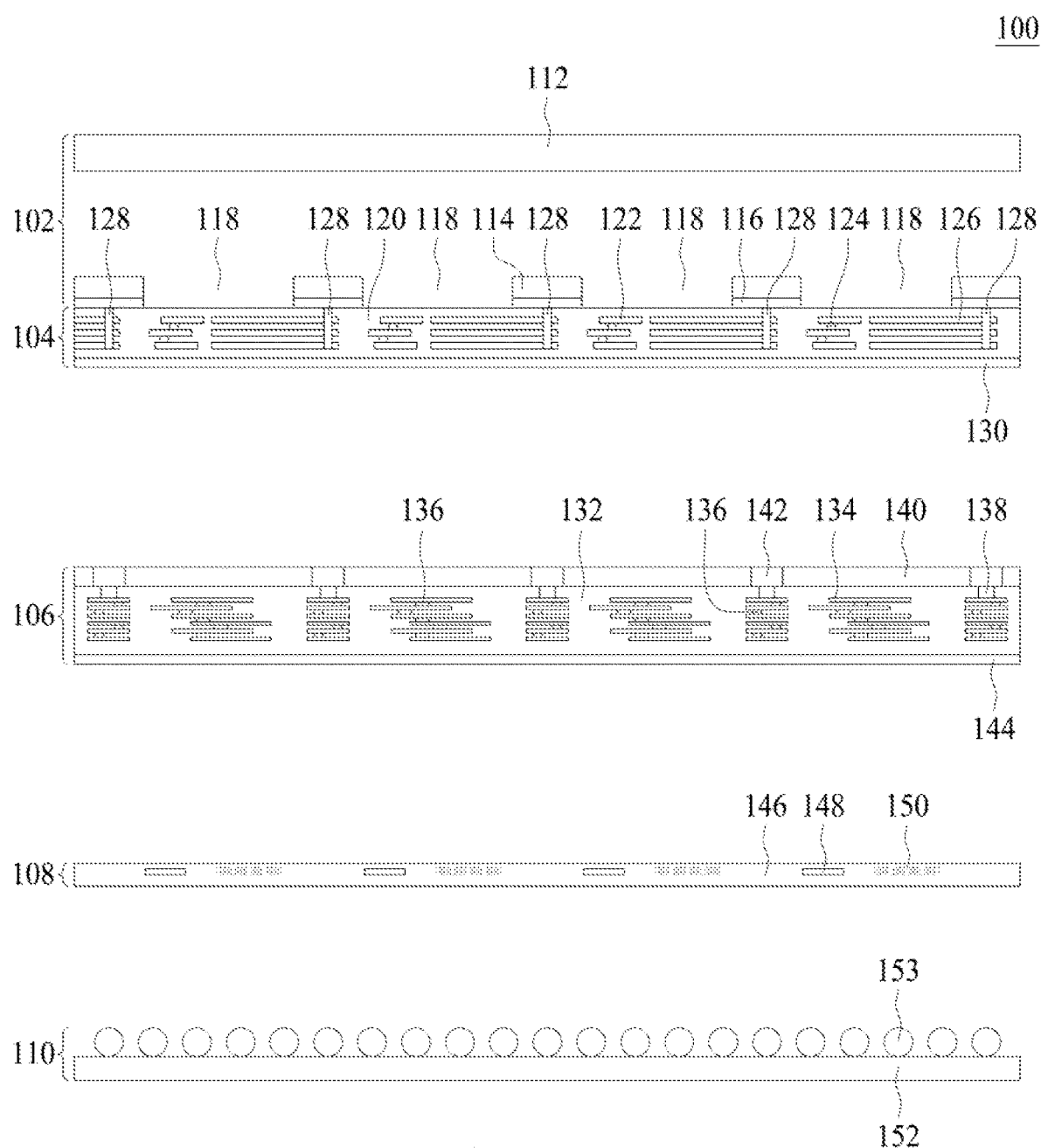

Turning now to FIG. 2B, there is illustrated another step in the manufacturing of the semiconductor device 100 in accordance with one embodiment. As shown in FIG. 2B, the analog component substrate 130 and the HPC component substrate 144 are depicted as having been thinned down in preparation of backside through silicon via (TSV) processing. It will be appreciated that such thinning of the analog component substrate 130 and the HPC component substrate 144 may be accomplished via chemical-mechanical polishing (CMP) or other suitable manufacturing method.

Figure 2C:
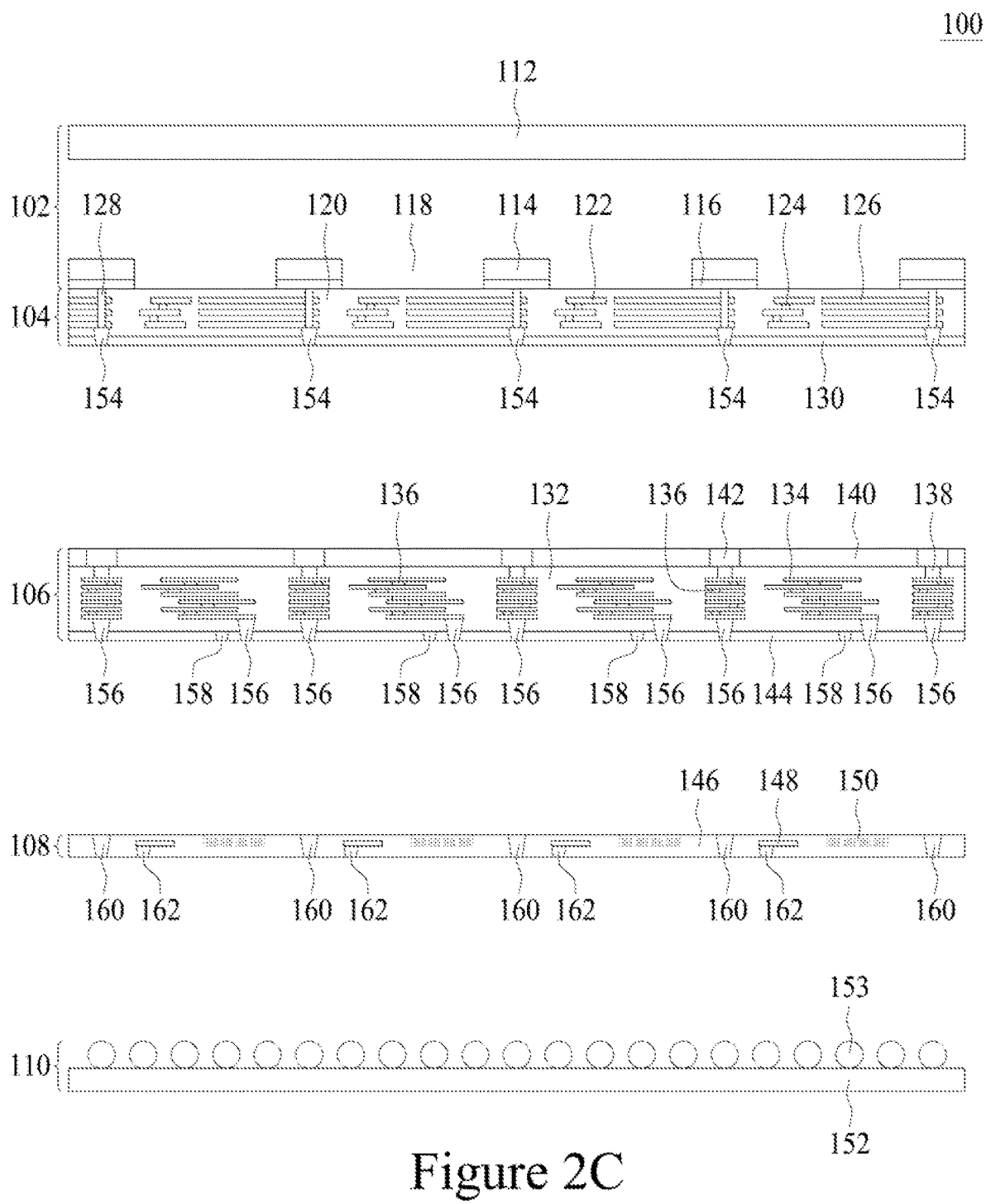

In FIG. 2C, the aforementioned TSV processing has been initiated on the analog circuit component 104, the HPC component 106, and the DTC component 108. As shown in FIG. 2C, analog component TSV cavities 154 have been formed in the analog circuit component 104. That is, an analog component TSV cavity 154 has been etched (e.g., patterned) into the analog substrate 130 in preparation for deposition of TSV material allowing connection between the analog circuit component 104 and the HPC component 106. In the HPC component 106, first HPC component TSV cavities 156 have been patterned and formed in the HPC insulative layer 132 between the HPC metal component 134 and through HPC substrate 144. Second HPC component TSV cavities 158 have been patterned and formed in the HPC substrate 144 in preparation for deposition of TSV material allowing connections between the HPC component 106 and the DTC component 108. In the DTC component 108, first DTC component TSV cavities 160 are formed through the DTC carrier substrate 146 in preparation for deposition of TSV material allowing connections between the HPC component 106 and the circuit board component 110. Second DTC component TSV cavities 162 are formed within the DTC carrier substrate 146 in preparation for deposition of TSV material allowing connections between the HPC component 106 and the DTC carrier substrate metal routing 148.

Figure 2D:
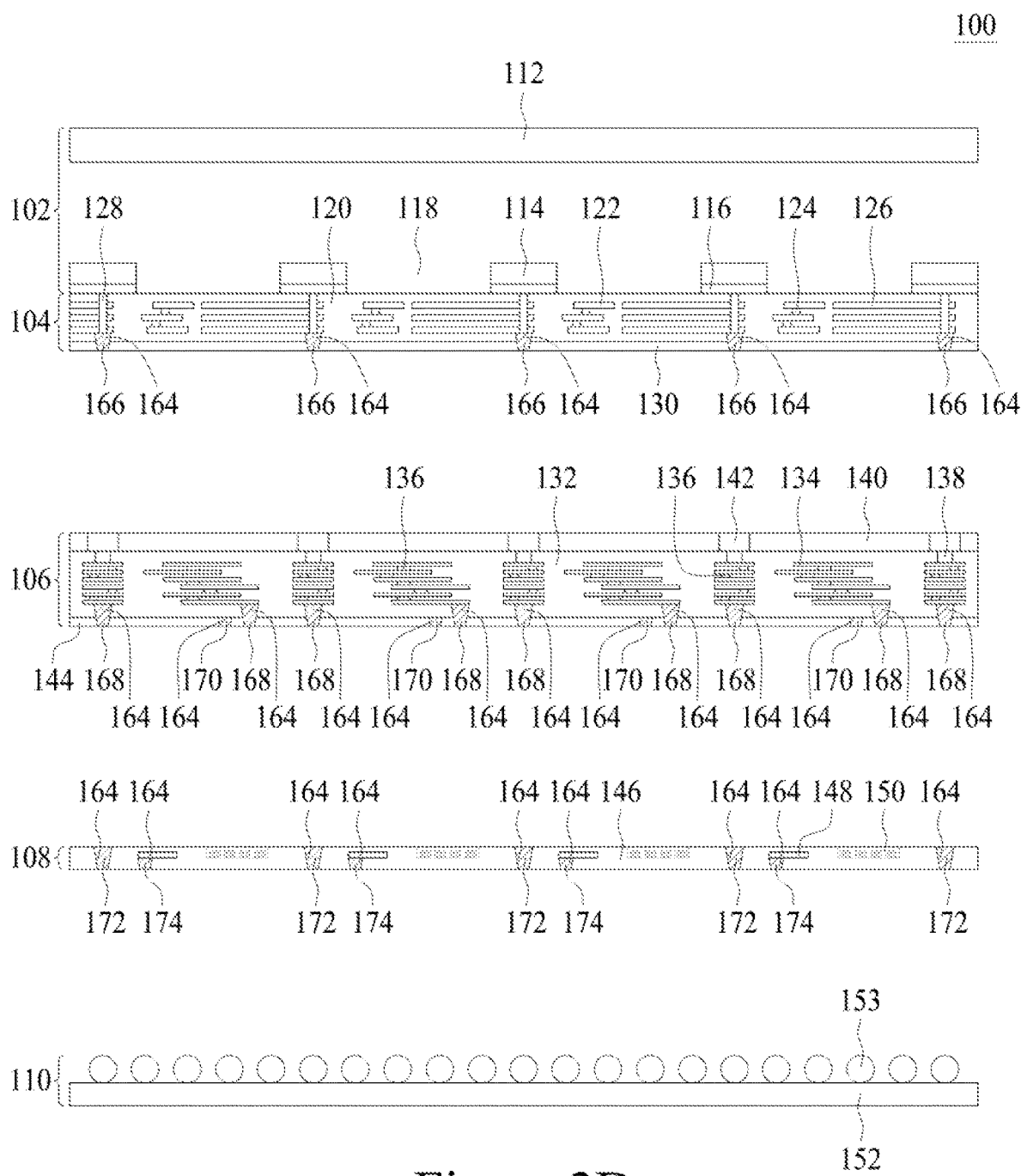

Turning now to FIG. 2D, the semiconductor device 100 is now illustrated with TSV material 164 having been deposited in the various TSV cavities 154-162. In accordance with some embodiments, the TSV material 164 may be implemented as a suitable conductive material, including, for example and without limitation, Cu, AlCu, or the like. As shown in FIG. 2D, the analog component TSV 166 (i.e., the analog component TSV cavity 154 filled with the TSV material 164) may be implemented with a lowest thickness (i.e., the portion through the analog circuit component substrate 130) may be in the range of about 1 um~2 um, and a highest thickness (i.e., the portion contacting the analog electrical routing 126) may be in the range of about 8 um~10 um. The first HPC component TSV 168 (i.e., the first HPC component TSV cavity 156 filled with the TSV material 164) may be implemented with a lowest thickness (i.e., the portion through the HPC substrate 144) may be in the range of about 1 um~2 um, and a highest thickness (i.e., the portion contacting the HPC metal component 134) may be in the range of about 8 um~10 um. The second HPC component TSV 170 (i.e., the second HPC component TSV cavity 158 filled with the TSV material 164) may be implemented with a lowest thickness (i.e., the portion through the HPC substrate 144) may be in the range of about 1 um~2 um, and a highest thickness (i.e., the portion contacting the HPC metal component 134) may be in the range of about 8 um~10 um.

The first DTC component TSV 172 (i.e., the first DTC component TSV cavity 160 filled with the TSV material 164) may be implemented with a lowest thickness (i.e., the portion through the bottom of the DTC carrier substrate 146) may be in the range of about 1 um~2 um, and a highest thickness (i.e., the portion through the top of the DTC carrier substrate 146) may be in the range of about 8 um~10 um. The second DTC component TSV 174 (i.e., the second DTC component TSV cavity 162 filled with the TSV material 164) may be implemented with a lowest thickness (i.e., the portion through the bottom of the DTC carrier substrate 146) may be in the range of about 1 um~2 um, and a highest thickness (i.e., the portion contacting the carrier substrate metal routing 148) may be in the range of about 8 um~10 um. It will be appreciated that the TSVs 166-174 may be deposited by, for example and without limitation, CVD, PVD, ALD, electroless plating, electrochemical plating, sputtering, ion metal plasma, another deposition process, or any suitable combination thereof.

Figure 2E:
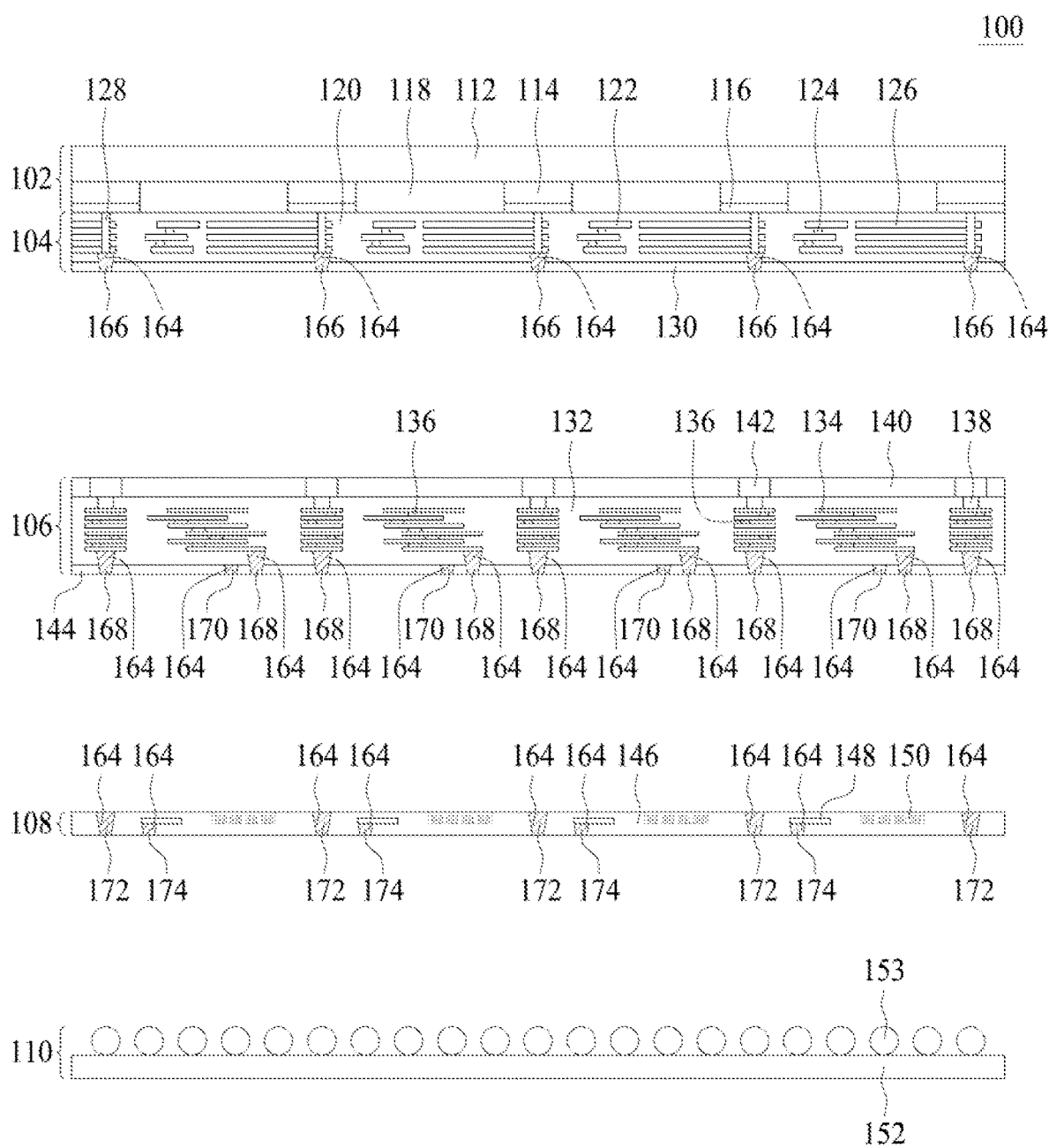

In FIG. 2E, the MEMS membrane substrate 112 is bonded to the MEMS sidewall 114 via any suitable bonding method, e.g., fusion, eutectic, hybrid, etc. Thereafter, as shown in FIG. 2E, the MEMS component 102 is bonded to the analog circuit component 104. In some embodiments, the MEMS membrane substrate 112 facilitates operation of the MEMS component 102 of the semiconductor device 100 (e.g., the MEMS membrane substrate 112 is the portion of the MEMS component 102 device that oscillates in response to an acoustic wave thereby producing a variable capacitance between a bottom electrode (not shown) and a top electrode (not shown) disposed on the MEMS membrane substrate 112 to produce an electrical signal; or conversely, the MEMS membrane substrate 112 is electrically energized with an AC signal to induce oscillation of the MEMS membrane substrate 112 to generate an acoustic wave). In some embodiments, the MEMS membrane substrate 112 is designed to contact a landing area of the bottom electrode (not shown) on each oscillation, thus providing a binary (i.e., digital) CMUT output. In accordance with some embodiments, the thickness of the MEMS membrane substrate 112 may be thinned after bonding, e.g., utilizing CMP or other mechanisms, which may increase the sensitivity of the MEMS component 102, durability of the membrane substrate 112, and the like.

Figure 2F:
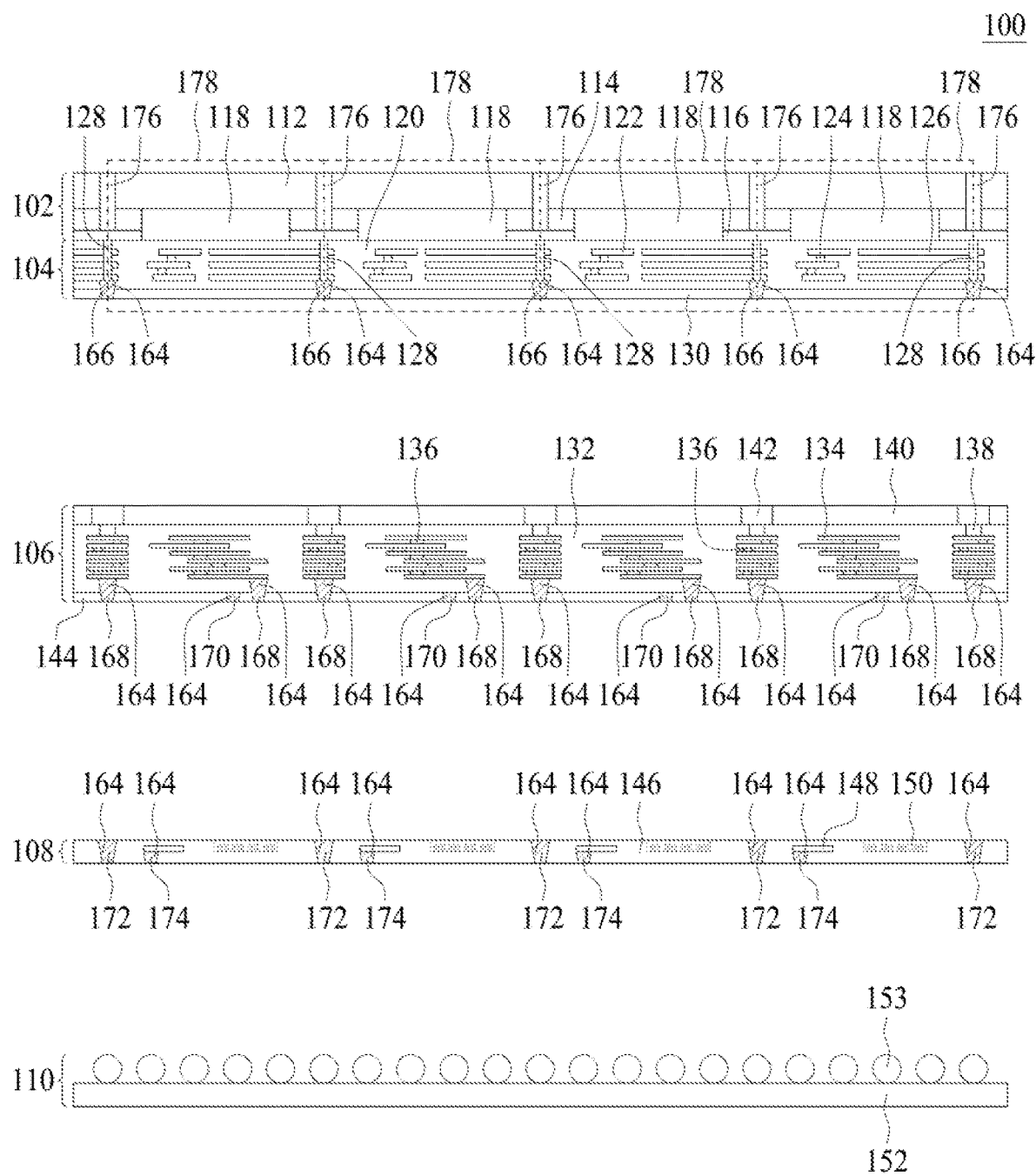

In FIG. 2F, an isolated trench 176 is illustrated in the MEMS component 102. According to some embodiments, the isolated trench 176 extends through the MEMS membrane substrate 112 and the MEMS sidewall 114 to the MEMS/analog bonding area 116, thereby providing mechanical isolation between individual MEMS pixels 178. As used herein, each MEMS pixel 178 corresponds to an individual MEMS device, i.e., that portion of the MEMS component 102 and analog circuit component 104 that are bonded together. In some embodiments, the isolated trench 176 is filled with an isolated material, such as a porous insulated material (e.g., oxide, polyamide, etc.), a composite material, or the like. It will be appreciated that when the isolated trench 176 is not utilized between MEMS pixels 178, mechanical coupling may occur, i.e., interference between adjoining MEMS pixels 178 during transmission or receiving.

Figure 4:
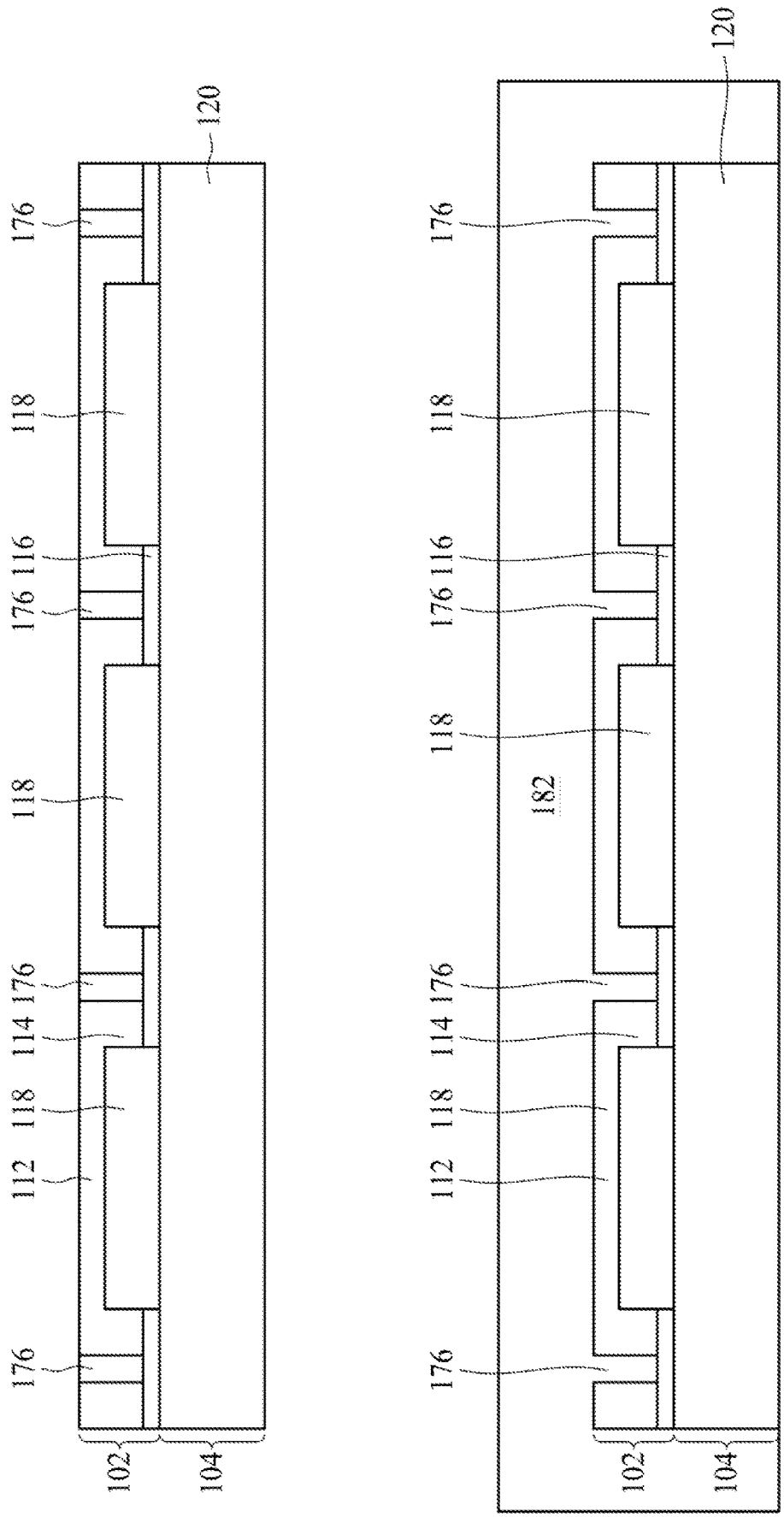
FIG. 4 is a comparative view of embodiments of an isolated trench in accordance with some embodiments.

Referring now to FIG. 4, there is shown another embodiment of the isolated trench 176 (of FIGS. 2F-2I) utilizing a second methodology. In FIG. 4, the isolated trench 176 is patterned at the chip level and an insulated molding 182, e.g., rubber, polymer, etc., is applied at the final device level to provide mechanical isolation between MEMS pixels 178. It will be appreciated that the approach described above with respect to FIG. 2F and the approach illustrated in FIG. 4 each provide mechanical isolation between MEMS pixels 178, thereby insulating the individual membranes of the pixels 178 from being impacting by operations of adjoining pixels 178. Other benefits to the use of the isolation material in the isolated trench 176 and the isolation molding 182 may include, for example and without limitation, electrical or electro-magnetic interference insulation between pixels 178.

Figure 2G:
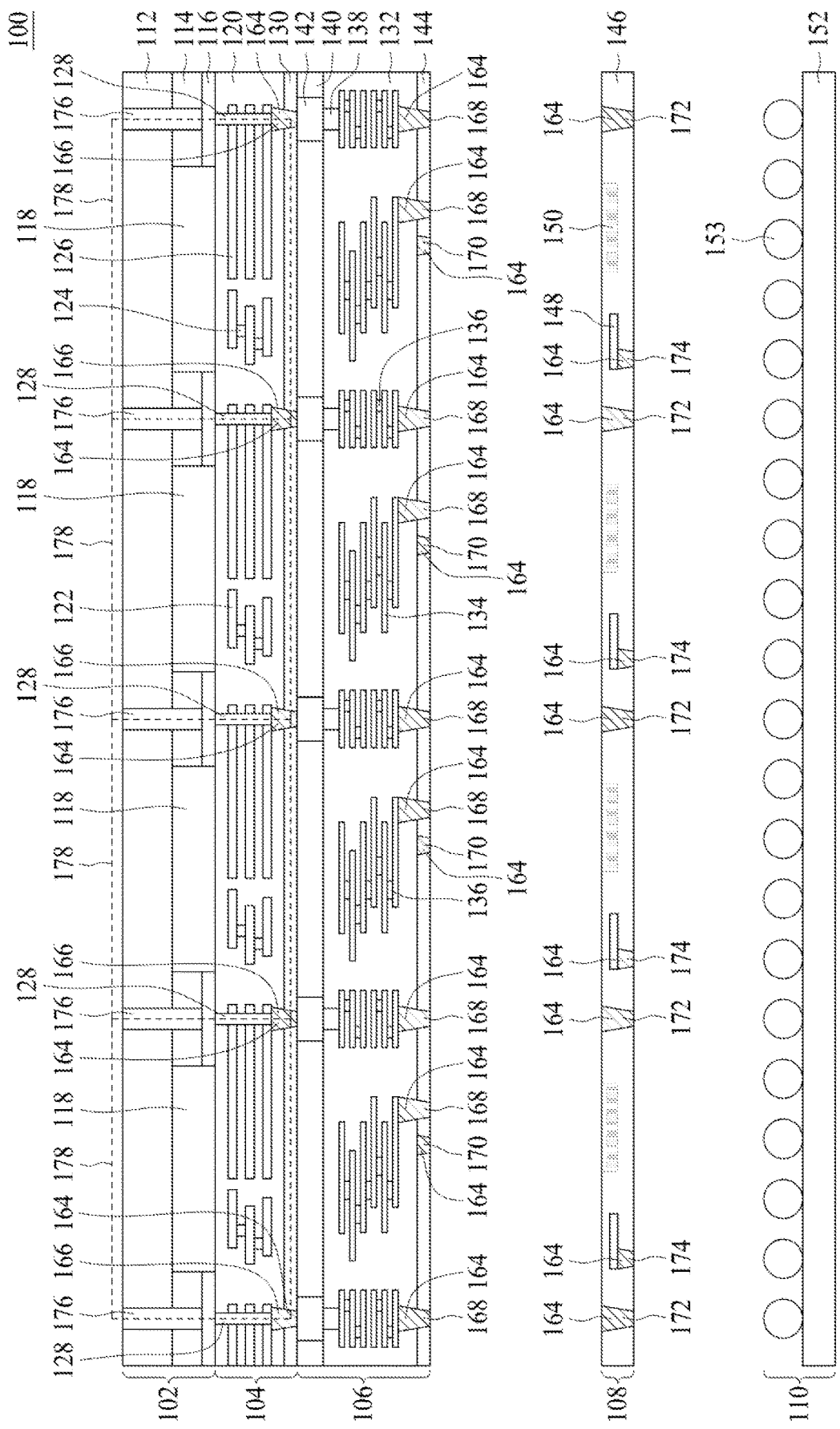

Returning now to FIG. 2G, there is shown the attachment of the combined MEMS component 102/analog circuit component 104 to the HPC component 106. As illustrated in FIG. 2G, the analog component vias 166 are now in contact with the bond pad via 138. Accordingly, the analog CMOS components 122 are thereby electrically connected to the HPC metal components 134 utilizing the analog component vias 166 and the bond pad vias 138 through the bond pad 142. It will be appreciated that the bonding of the analog circuit component 104 to the HPC component 106 may be accomplished via any suitable bonding means. Further, each MEMS pixel 178 is now in electrical communication with the HPC component 106, enabling the HPC component 106 to control operations thereof.

Figure 2H:
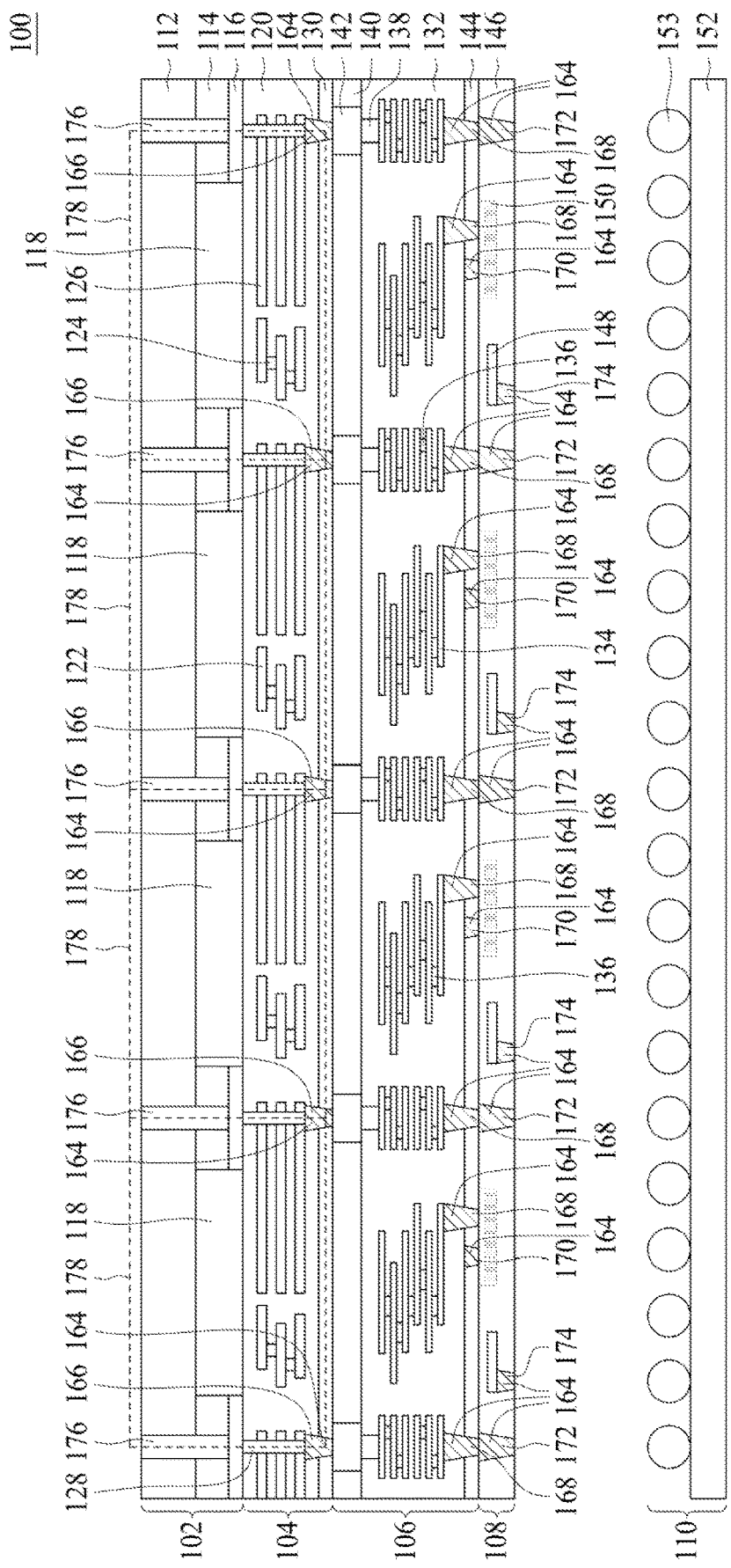

Turning now to FIG. 2H, there is shown the bonding of the DTC component 108 to the HPC component 106. As illustrated in FIG. 2H, the first HPC component vias 168 are now in contact with the first DTC component vias 172 or in contact with the DTC die 150, thereby providing connectivity of the HPC metal components 134 to the first DTC component vias 172 or to the capacitors of the DTC die 150. The second HPC component vias 170 are depicted now in contact with the DTC die 150 through the HPC substrate 144. The interconnectivity of the first HPC component vias 168 to the first DTC component vias 172 will be better understood in view of FIG. 2I, which illustrates attachment of the DTC component 108 and the circuit board component 110.

Figure 2I:
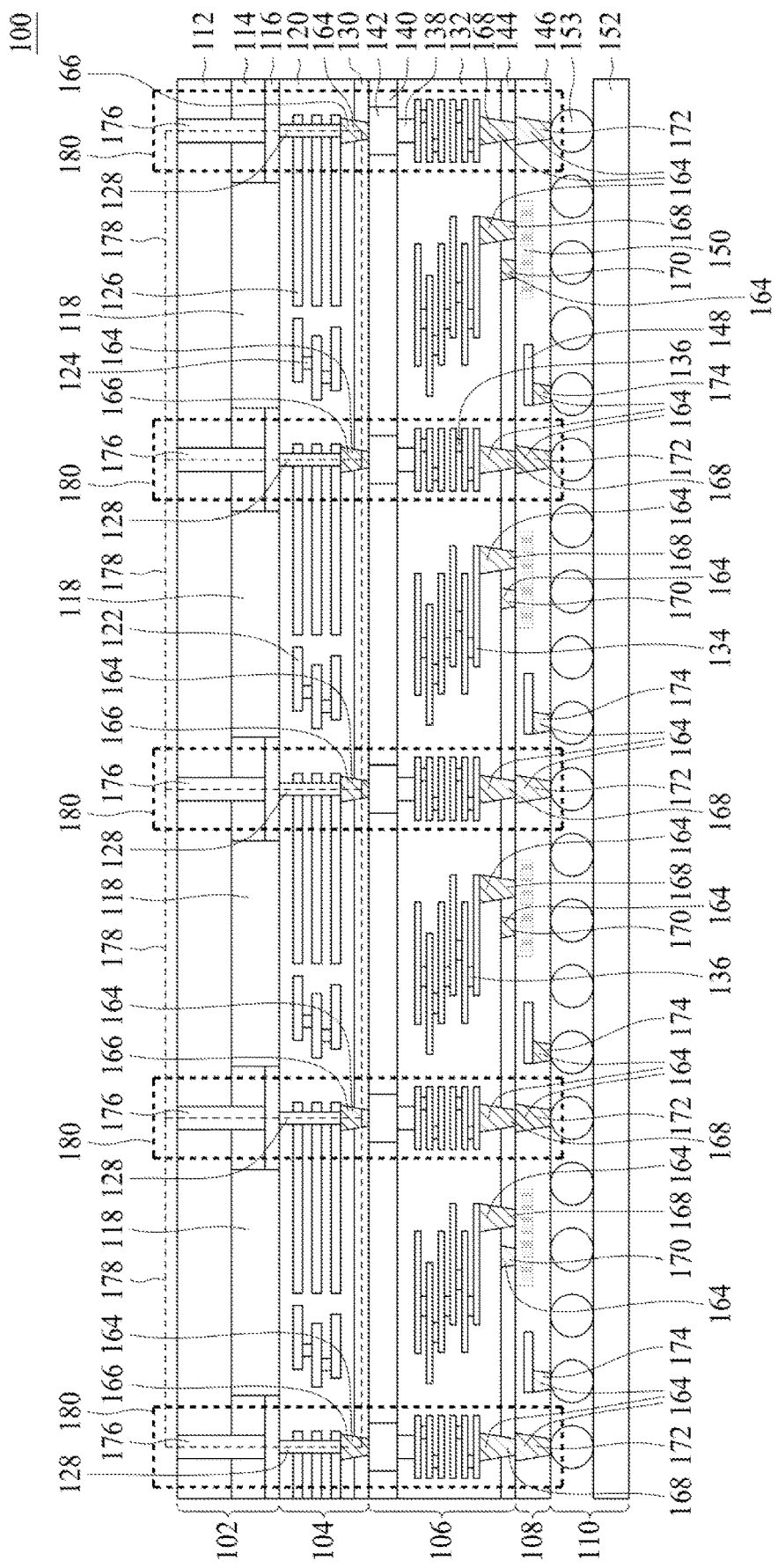

As illustrated in FIG. 2I, the previously joined components (i.e., the MEMS component 102, the analog circuit component 104, the HPC component 106, and the DTC component 108) are now joined to the circuit board component 110 via the various solder balls 153 shown on the top side of the printed circuit board 152. As shown in FIG. 2I, the previous joining of the first HPC component vias 168 to the first DTC component vias 172 thereby enable connectivity of the HPC component 106 with the printed circuit board 152. Further, the second DTC component vias 174 provide connectivity from the DTC carrier substrate metal routing 148 to the printed circuit board 152.

FIG. 2I further illustrates cascaded seal rings 180 positioned between MEMS pixels 178 to provide noise shielding capability to the semiconductor device 100, i.e., external noise or noise between MEMS pixels 178). It will be appreciated that in some embodiments, the cascaded seal ring 180 surrounds every MEMS pixel 178 of a MEMS array (shown in FIGS. 5A-5B as the MEMS array 500). In the cross-sectional view of FIG. 2I, however, the skilled artisan will appreciate that the analog circuit component 104 includes several metal components or layers (i.e., analog electrical routing 126), however not all such analog electrical routing 126 may be used as a seal ring, as some of the analog electrical routing 126 is utilized for circuit routing or other purposes. Accordingly, while not all of the analog electrical routing 126 is used as seal rings, the cascaded seal rings 180 are connected/grounded horizontally/vertically to provide shielding capability.

Figure 5A:
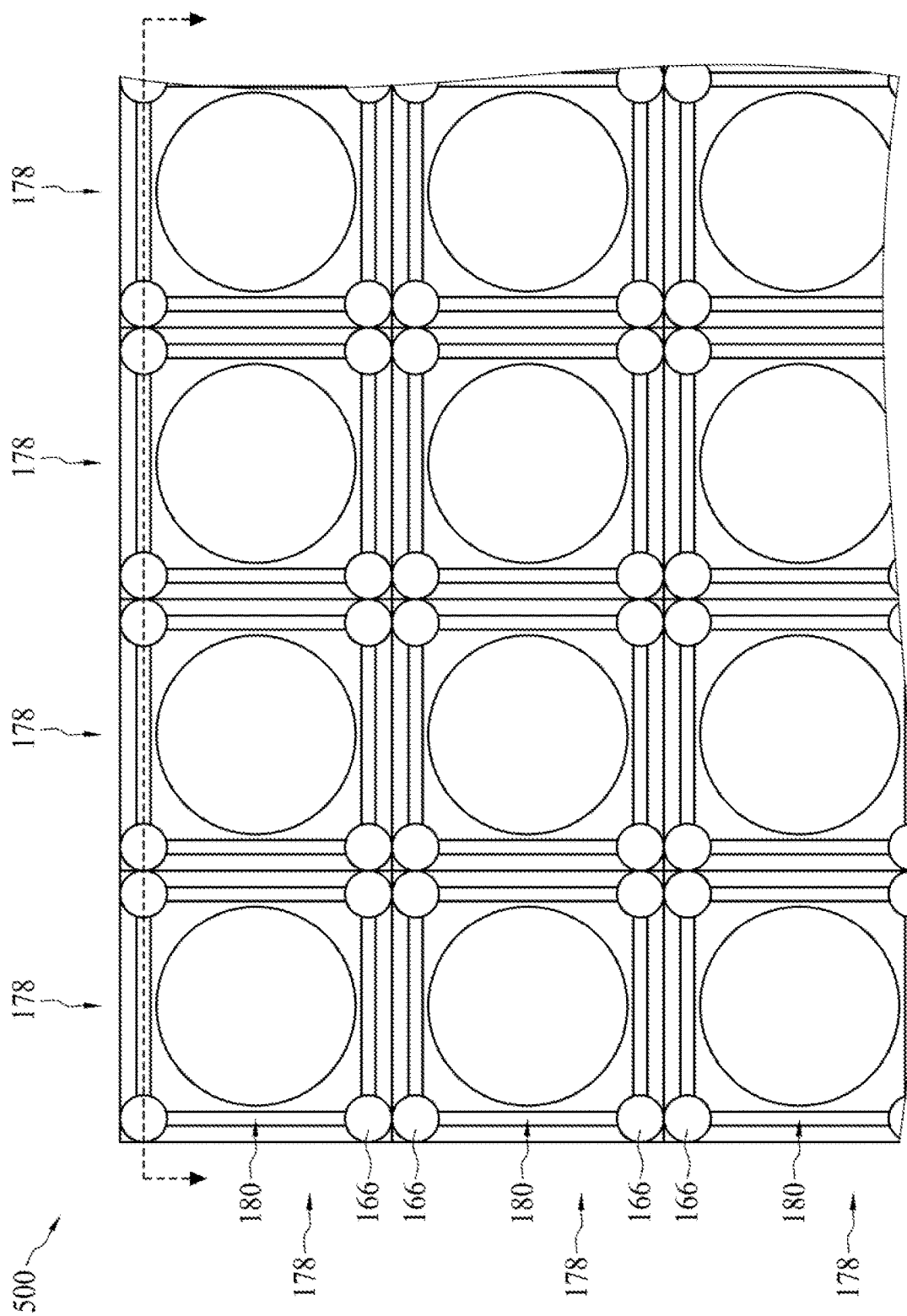
FIG. 5A is an illustrative top view of MEMS array in accordance with some embodiments.
Figure 5B:
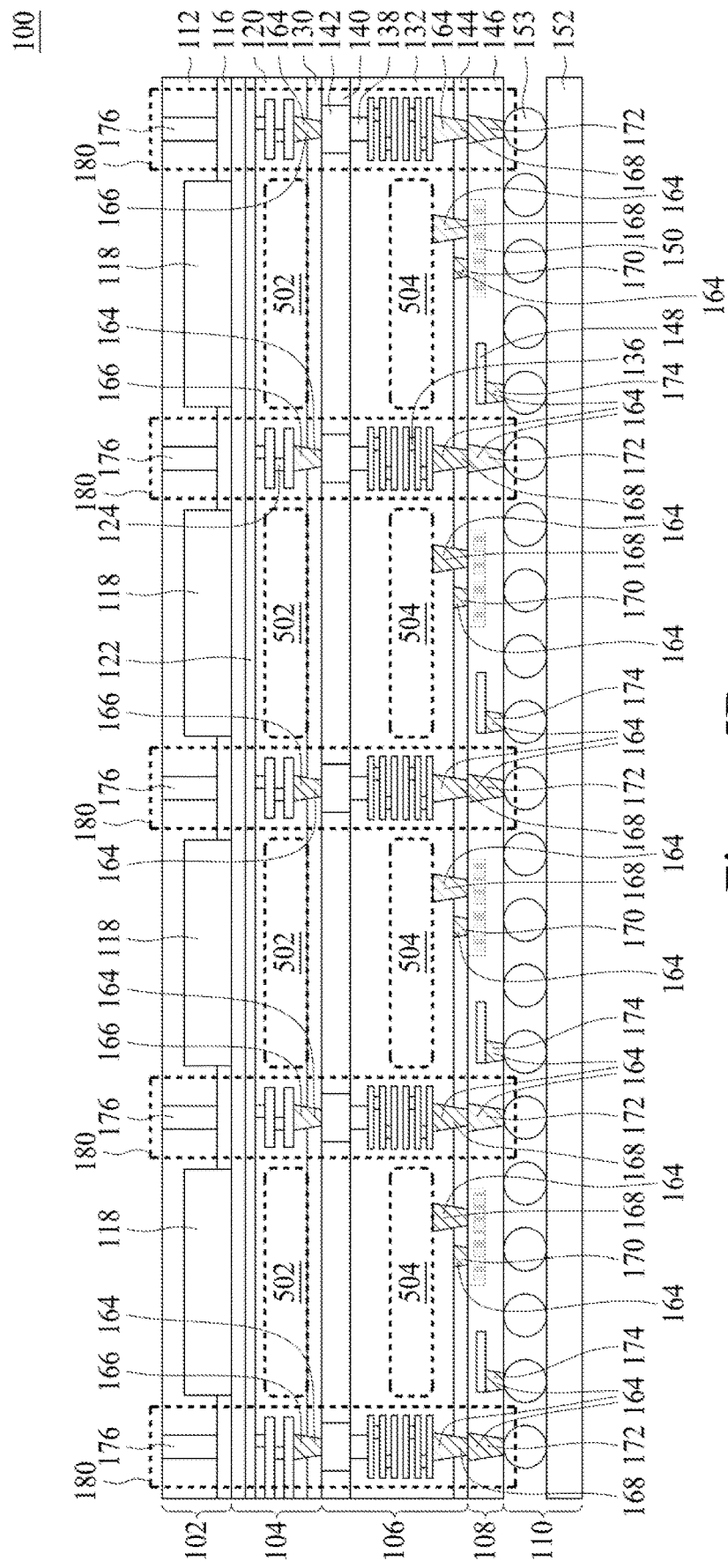
FIG. 5B is a simplified cross-sectional view of the MEMS array of FIG. 5A.

For example, the top view of a portion of a MEMS array 500 comprising a plurality of MEMS pixels 178 is illustrated in FIG. 5A. A simplified cross-sectional view of the MEMS array 500 is illustrated in FIG. 5B. Referring now to FIG. 5A, each MEMS pixel 178 is illustrated with an exemplary seal ring 180 which surrounds the MEMS pixel 178, thereby providing shielding to the active components located within the seal ring 180. As illustrated in FIG. 5A, the cavity 118 is positioned within the seal ring 180, along with the corresponding sensing electrodes (not shown). For illustrative purposes, the analog component TSV 166 is shown, providing vertical and horizontal connections of the cascaded seal rings 180. As previously discussed, some embodiments contemplated herein provide for the seal ring 180 to surround each MEMS pixel 178, but not fully surrounded at all layers of the MEMS component 102, whereas the circuit layers of the analog circuit component 104 and the HPC component 106 do not. As will be appreciated, the circuit portions of the semiconductor device 100 (shown in FIG. 5B as the analog circuits 502 and the HPC circuits 504) generally have a larger area than a single MEMS pixel 178, so usage of the same pattern of the seal ring 180 in the analog circuit component 104 and the HPC component 106 is problematic. However, in accordance with one embodiment, as illustrated in FIG. 5B, the vertical grounding of the seal ring 180 (i.e., utilizing TSV components 166, 168, and 172) may still be accomplished, thereby providing additional shielding to the MEMS pixels 178.

The skilled artisan will appreciate that the foregoing description of the joining of the various components 102-110 is intended solely as one possible order of forming the semiconductor device 100. Accordingly, any order of joining the components 102-110 is contemplated herein, e.g., joining the circuit board component 110 to the DTC component 108, then attaching the HPC component 106 to the DTC component 108, followed by attaching the analog circuit component 104 to the HPC component 106, and finishing with the bonding of the MEMS component 102 to the analog circuit 104. As another illustrative example, the HPC component 106 may first be attached to the DTC component 108, with the attachment of the MEMS component 102 to the analog circuit component 104 occurring simultaneously therewith (i.e., in another location, fab, facility, chamber, etc.), whereafter the two (the HPC component 106/DTC component 108 combination and the MEMS component 102/analog circuit component 104) are attached together followed by affixing the four combined components (i.e., 102-108) to the circuit board component 110. Accordingly, the skilled artisan will appreciate that the order of attachment presented in FIGS. 2E-2I are intended merely to illustrate the contact points and connections between the components 102-110 and not to limit the order in which the semiconductor device 100 is assembled.

Figure 6A:
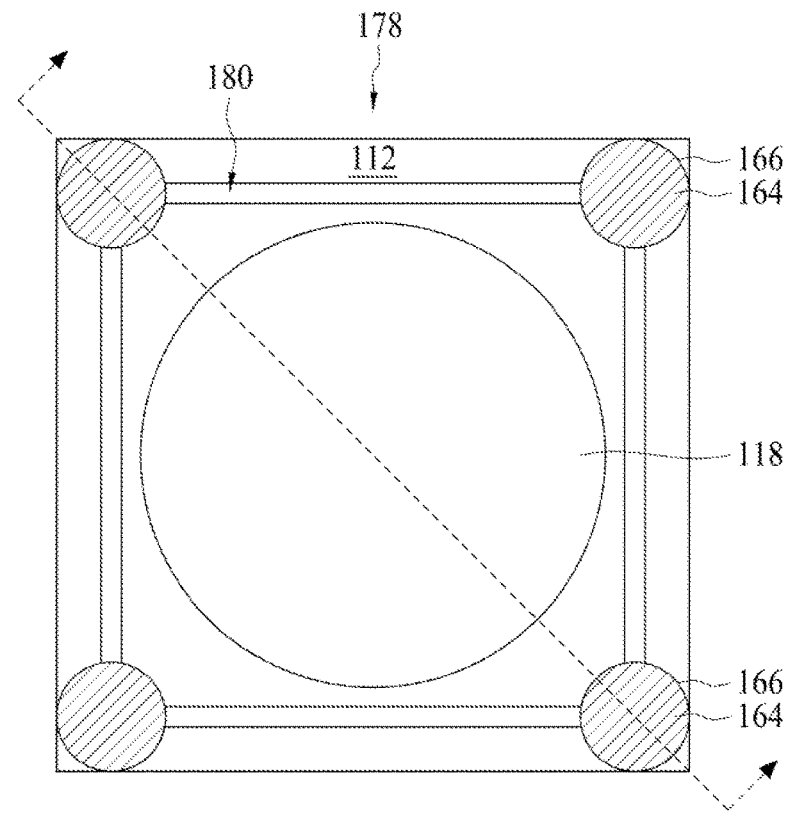
FIGS. 6A-6D are top and cross-sectional views of MEMS pixel patterns in accordance with some embodiments.
Figure 6A:
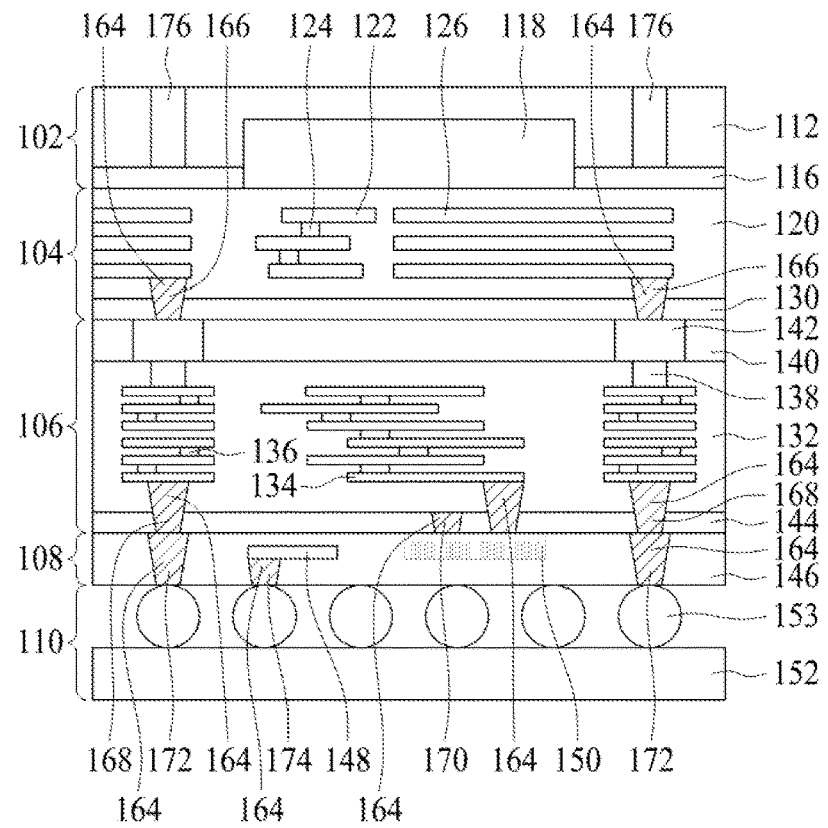
Figure 6B:
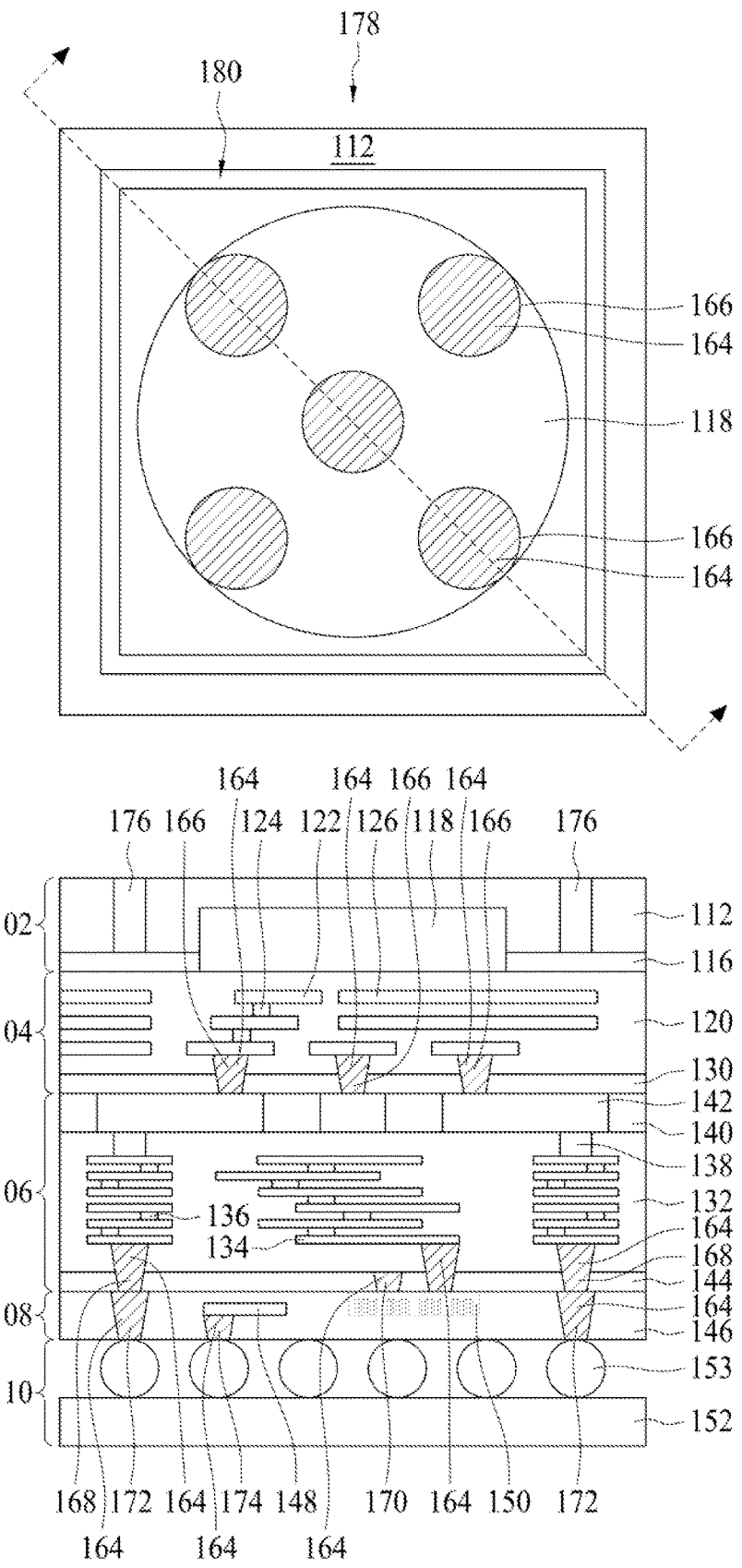
Figure 6C:
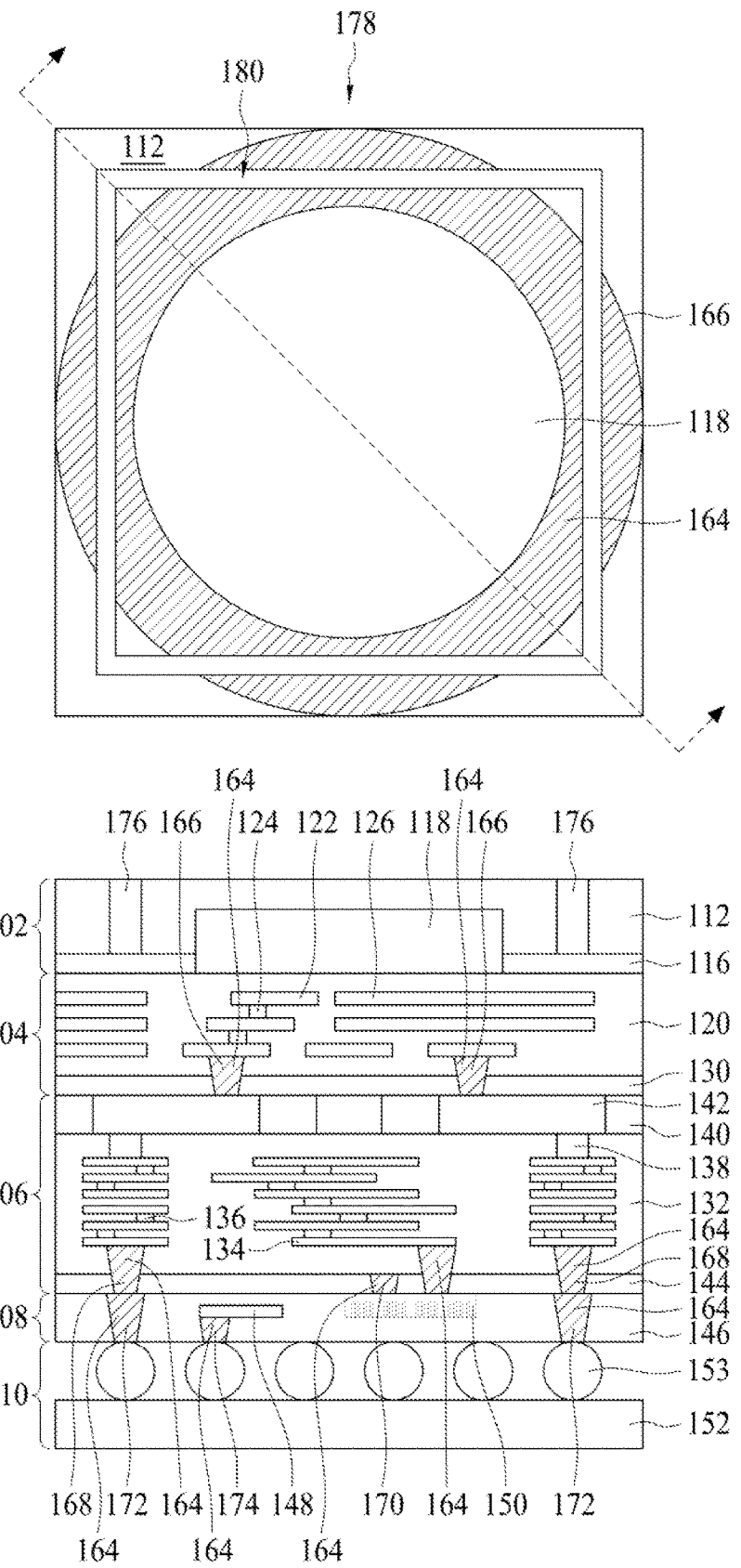
Figure 6D:
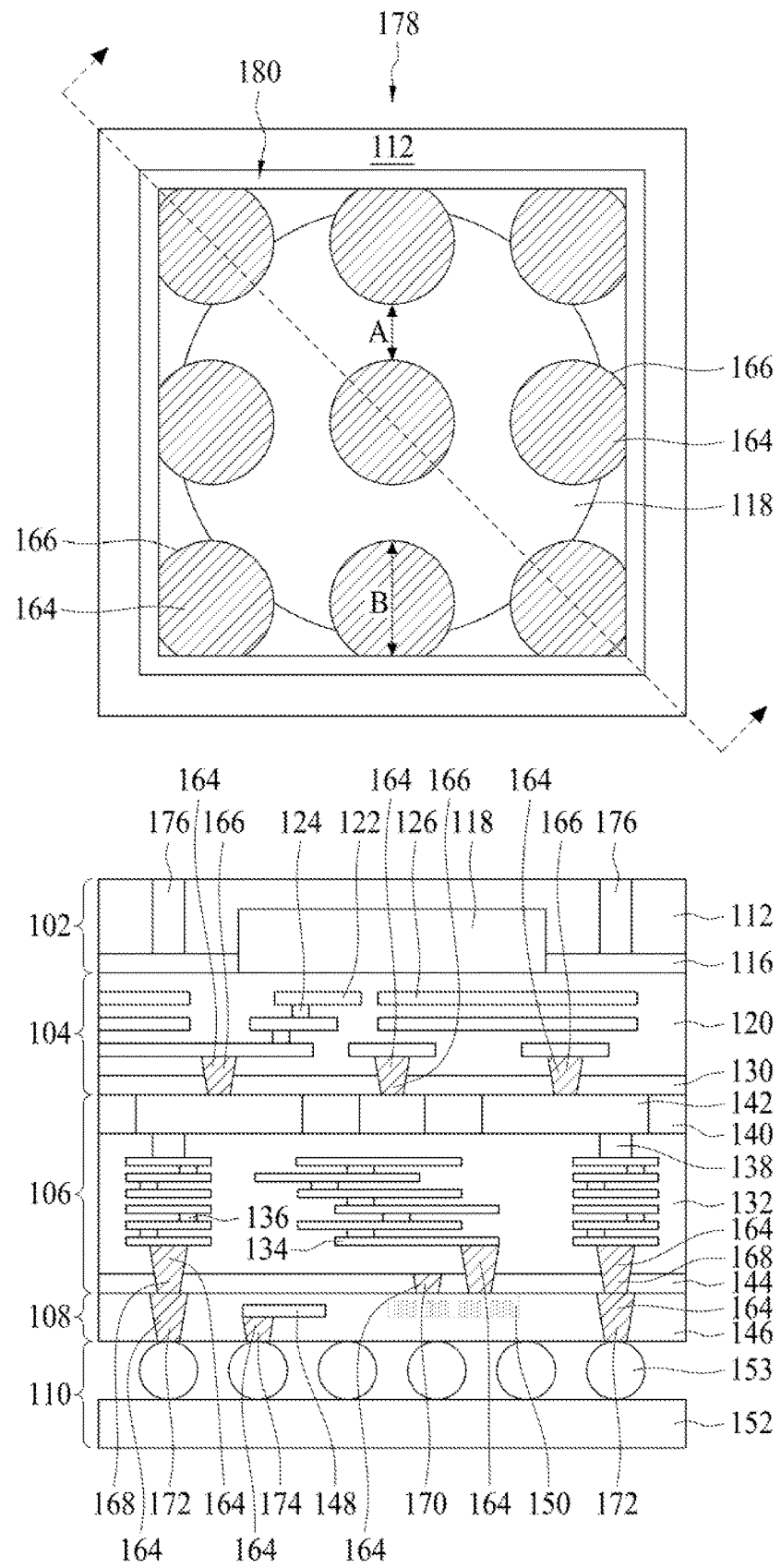

Turning now to FIGS. 6A-6D, there is shown the positioning of through-silicon vias (TSV) in accordance with varying embodiments of the subject application. That is, FIGS. 6A-6D provide alternate embodiments of the positioning of the analog component TSV 166 relative to the cavity 118 and the cascaded seal ring 180. As shown in FIG. 6A, a first analog component TSV 166 pattern is illustrated, wherein the analog component TSVs 166 are positioned at each corner of the MEMS pixel 178, i.e., outside the cavity 118 and/or cascaded seal ring 180 location. In FIG. 6B, the analog component TSVs 166 are located directly below the cavity 118, i.e., overlapping with the seal ring 180. In FIG. 6C, the analog component TSVs 166 are positioned surrounding the cavity 118, thereby overlapping the seal ring 180. In FIG. 6D, the analog component TSVs 166 are densely proportioned below the cavity 118 and overlapping with the cavity 118 and/or seal ring 180. As shown in FIG. 6D, each analog component TSV 166 may be implemented a distance "A" from the adjoining TSV 166, wherein the distance "A" is greater than 0.5 um and may be in the range of about 0.5 um~5 um. Further, the diameter of the analog component TSV 166 in FIG. 6D may be greater than 0.5 um and may be in the range of about 0.5 um~5 um.

Figure 7A:
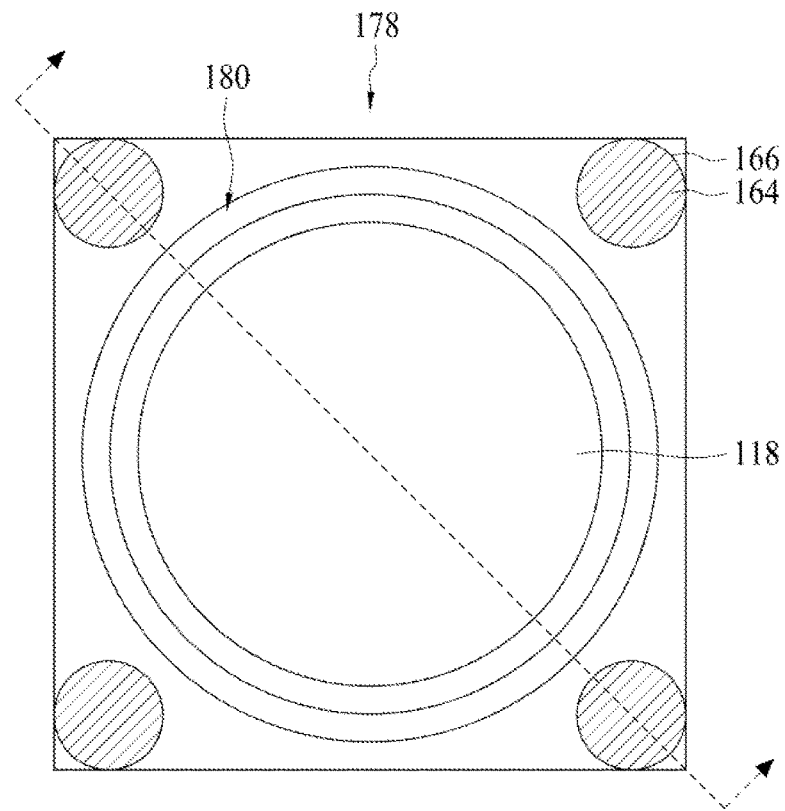
FIGS. 7A-7D are top and cross-sectional views of MEMS pixel patterns in accordance with some embodiments.
Figure 7A:
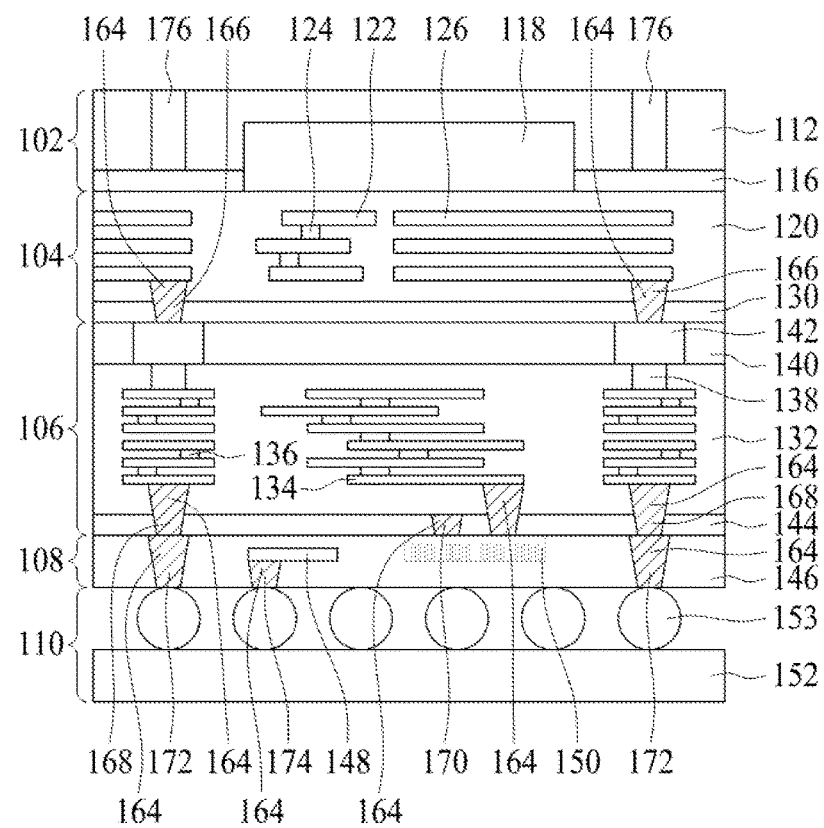
Figure 7B:
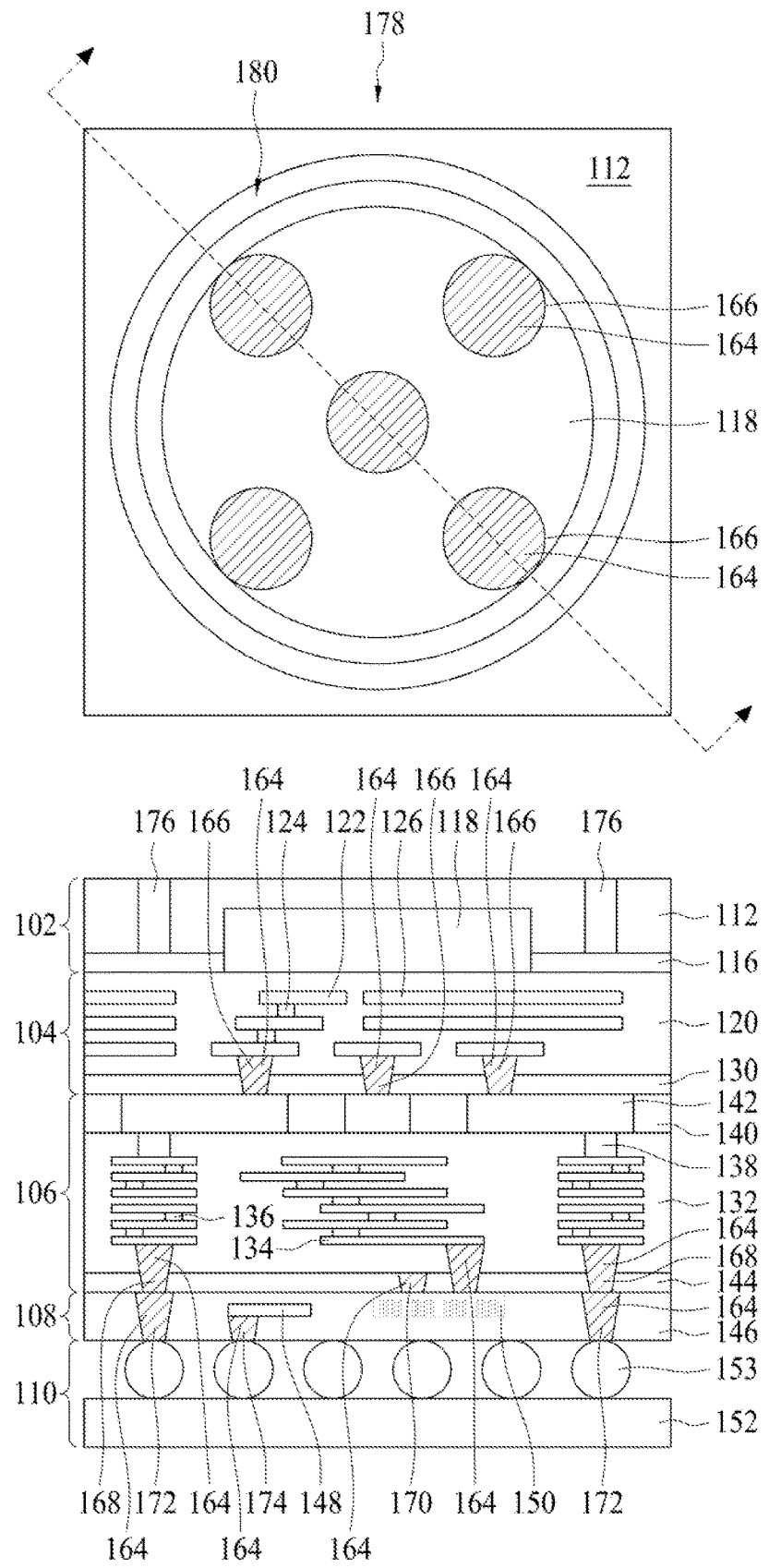
Figure 7C:
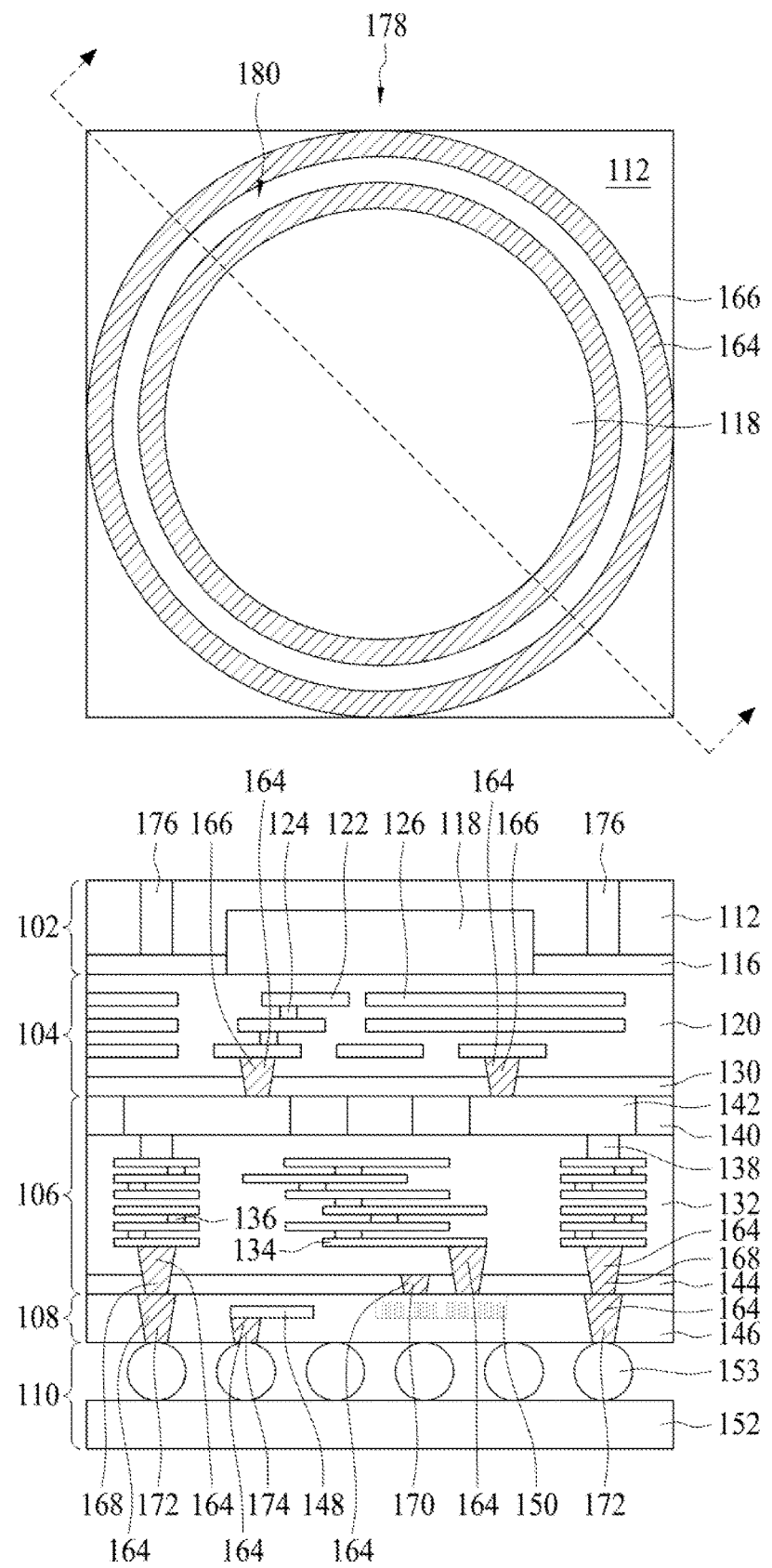
Figure 7D:
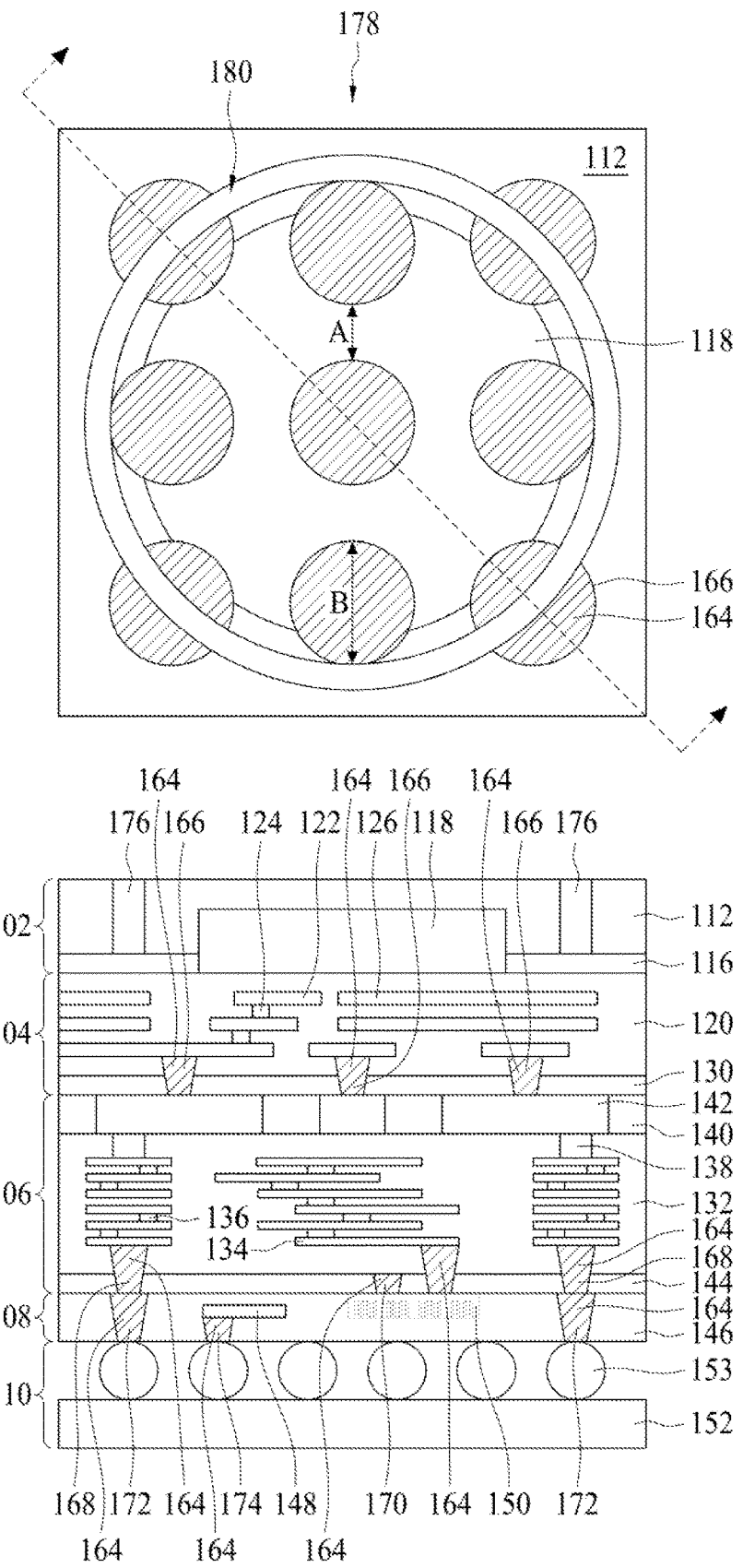
Figure 8:
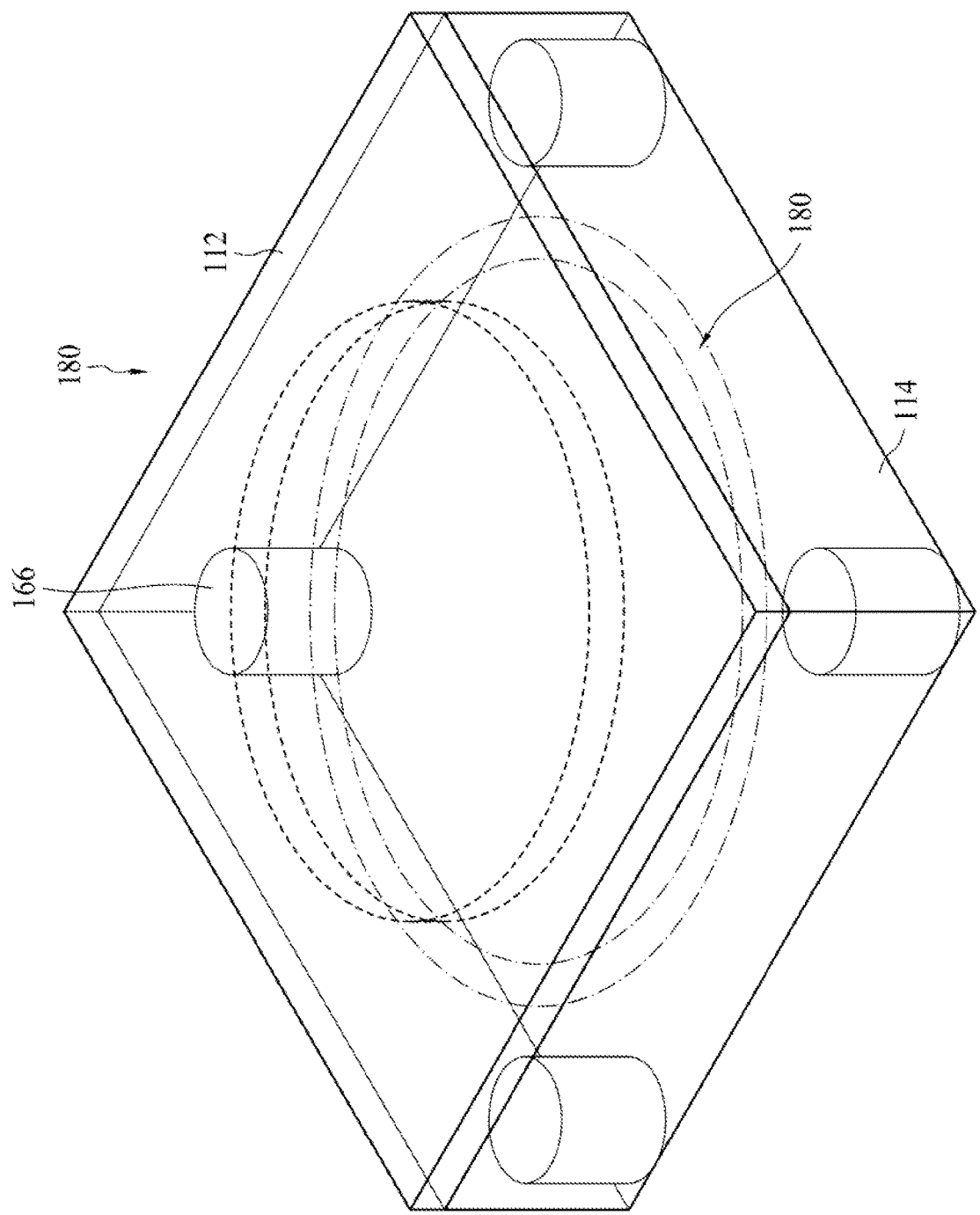
FIG. 8 is an isometric view of a MEMS pixel in accordance with some embodiments.

It will be appreciated that the illustration of the seal ring 180 in FIGS. 6A-6D is shown to illustrate the position of the TSVs 166 and that while depicted as a square, the seal ring 180 may be deposited and formed as in a circular manner around the cavity 118 in accordance with various design considerations. Accordingly, the illustrations in FIGS. 6A-6D are intended merely to illustrate variations in the formation of the analog component TSV 166 positioning relative to the location of the active components, i.e., the sensing electrodes, movable membrane, etc. Accordingly, FIGS. 7A-7D illustrate formation of the seal ring 180 in a circular formation. As shown in FIG. 7A, a first analog component TSV 166 pattern is illustrated, wherein the analog component TSVs 166 are positioned at each corner of the MEMS pixel 178, i.e., outside the cavity 118 and/or cascaded seal ring 180 location. FIG. 8 provides an isometric illustration of an individual MEMS pixel 178 in accordance with the embodiment set forth in FIG. 7A. As shown in FIG. 8, the MEMS pixel 178 may have a length in the range of about 50 um~1000 um.

Returning to FIG. 7B, a second embodiment of a circular seal ring 180 pattern is depicted, wherein the analog component TSVs 166 are located directly below the cavity 118, i.e., overlapping with the seal ring 180. In FIG. 7C, the analog component TSVs 166 are positioned surrounding the cavity 118, thereby overlapping the seal ring 180. In FIG. 7D, the analog component TSVs 166 are densely proportioned below the cavity 118 and overlapping with the cavity 118 and/or seal ring 180. As shown in FIG. 7D, each analog component TSV 166 may be implemented a distance "A" from the adjoining TSV 166, wherein the distance "A" is greater than 0.5 um and may be in the range of about 0.5 um~5 um. Further, the diameter of the analog component TSV 166 in FIG. 7D may be greater than 0.5 um and may be in the range of about 0.5 um~5 um.

Figure 9:
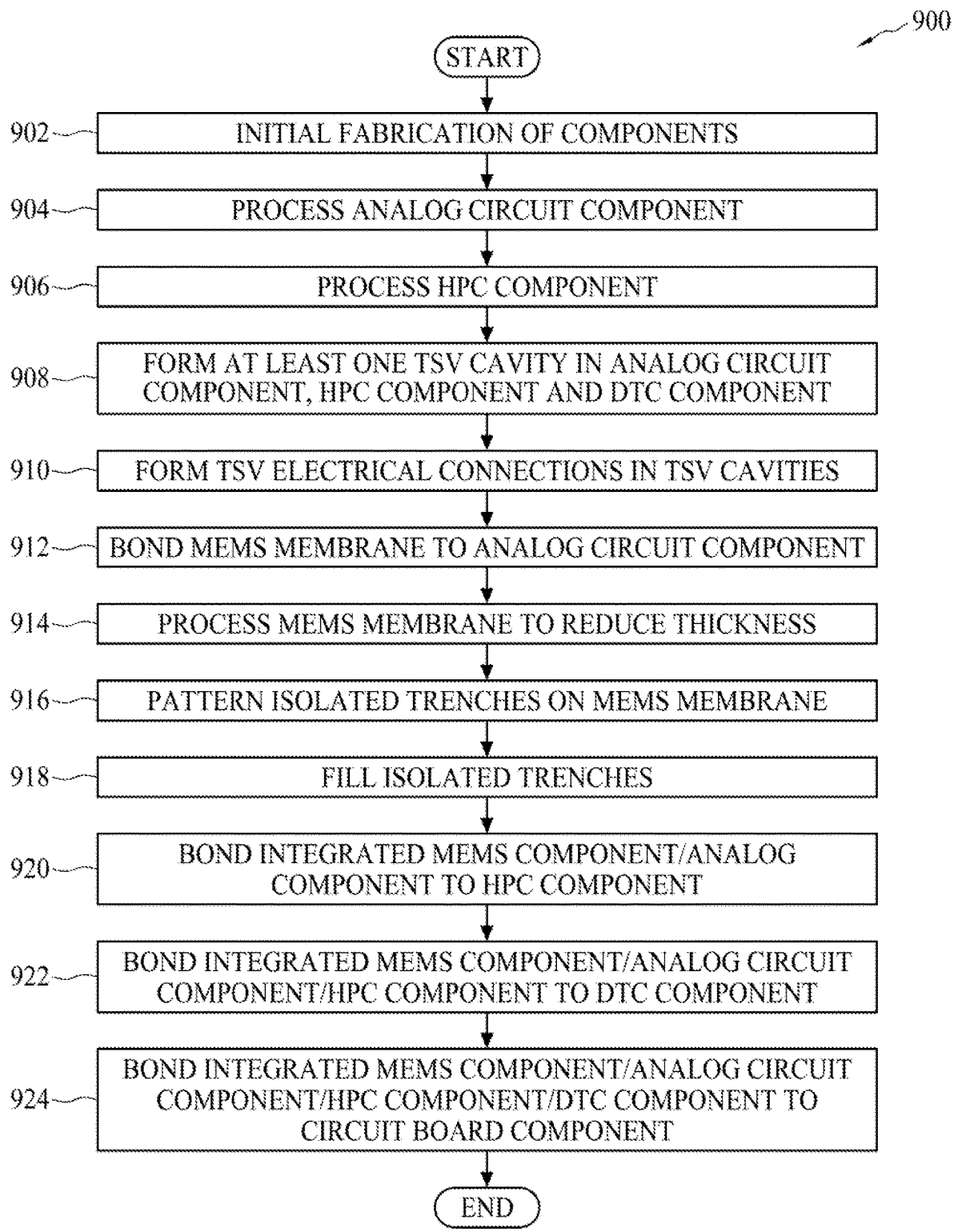
FIG. 9 is a method for forming a semiconductor device in accordance with some embodiments.

Referring now to FIG. 9, there is shown a flowchart illustrating a method for forming the semiconductor device 100 in accordance with some embodiments. As shown in FIG. 9, the method 900 begins with the fabrication of the various components 102-110 of the semiconductor device 100. As indicated above, the fabrication of each component 102-110 may occur independently and in any order of fabrication. In some embodiments, one or more of the components 102-110 may be fabricated at different facilities. Further, in other embodiments, one or more components 102-110 may be fabricated at different times prior to formation of the semiconductor device 100. That is, the MEMS component 102 may be fabricated at a first fab (Fab 1), the analog component 104 may be fabricated at a second fab (Fab 2), the HPC component 106 may be fabricated at a third fab (Fab 3), the DTC component 108 may be fabricated at a fourth fab (Fab 4), and the circuit board component 110 may be fabricated at a fifth fab (Fab 5). Further, operations at any of the aforementioned fabs (Fabs 1-5) may occur simultaneously, sequentially, or variations thereof. It will be appreciated that each component 102-110 may utilize different manufacturing techniques and technologies. Thus, fabrication of the components 102-110 may occur at the aforementioned different fabs. Accordingly, at 902, initial fabrication of the components 102-110 is performed. For example, the MEMS component 102 is fabricated in Fab 1, the analog circuit component 104 is fabricated in Fab 2, the HPC component 106 is fabricated in Fab 3, the DTC component 108 is fabricated at Fab 4, and the circuit board component 110 is fabricated at Fab 5.

At 904, the analog circuit component 104 is processed to reduce the thickness of the analog circuit component substrate 130. In some embodiments, CMP or other means are used to reduce the thickness of the analog circuit component substrate 130 in anticipation of the formation of TSV cavities 154. At 906, the HPC component 106 is processed to reduce the thickness of the HPC substrate 144. In some embodiments, CMP or other means are used to reduce the thickness of the HPC substrate 144 in anticipation of the formation of TSV cavities 156 and 158. It will be appreciated that the processing of steps 904 and 906 may be performed at the initial fabs, or alternatively may be performed at different fab.

At 908, at least one TSV cavity 154-162 is formed in the analog circuit component 104, the HPC component 106, and the DTC component 108. As will be appreciated, the formation of the TSV cavities 154-162 may be performed at the fab corresponding to the initial fabrication of the components 104-108, at one of the initial fabs, or at a different fab.

At 910, TSV electrical connections are formed in the TSV cavities 154-162 of the analog circuit component 104, the HPC component 106, and the DTC component 108. That is, TSV material 164 is deposited in the analog component TSV cavity 154 to form the TSV electrical connection, i.e., the analog component TSV 166. Similarly, TSV material 164 is deposited in the first HPC component TSV cavity 156 and the second HPC component TSV cavity 158 to form the TSV electrical connections, i.e., the first HPC component TSV 168 and the second HPC component TSV 170, respectively. In addition, TSV material 164 is deposited in the first DTC component TSV cavity 160 and the second DTC component TSV cavity 162 to form the TSV electrical connections, i.e., the first DTC component TSV 172 and the second DTC component TSV 174, respectively. As will be appreciated, the formation of the TSV electrical connections, i.e., the TSVs 166-174 may be performed at the fab corresponding to the initial fabrication of the components 104-108, at one of the initial fabs, or at a different fab. In some embodiments, the TSV material 164 may be implemented as AlCu, Cu, Al, or other suitable conductive metal.

As indicated above, the bonding of the components 102-110 to each other may be performed in any suitable order, and the steps illustrated in FIG. 9 are intended solely to indicate the bonding positions and not the order of when the components are bonded to each other. That is, steps 912, 920, 922, and 924 may be performed in any order and the illustration in FIG. 9 is intended as one possible order for bonding the components 102-110. Accordingly, at 912, the MEMS membrane substrate 112 of the MEMS component 102 is bonded to the top of the analog circuit component 104, thereby forming an integrated MEMS component 102/analog circuit component 104. In accordance with some embodiments, the bonding may be accomplished via fusion bonding, eutectic bonding, hybrid bonding, etc. It will be appreciated that the bonding described herein corresponds to wafer-level bonding. At 914, the MEMS membrane substrate 112 is processed to reduce the thickness thereof.

Suitable mechanisms for thickness reduction include, for example and without limitation, CMP, etching, etc. At 916, isolated trenches 176 are patterned on the MEMS membrane substrate 112. It will be appreciated that patterning of the isolated trenches 176 may employ any suitable patterning technique such as a photolithographic patterning technique using deposition of a photoresist layer and selective exposure via a photomask to visible light, ultraviolet light, deep ultraviolet light (i.e., DUV lithography), extreme ultraviolet light (i.e. EUV lithography), or so forth, followed by development of the exposed photoresist and subsequent etching to remove the uncovered portions of the MEMS membrane substrate 112. In other embodiments, patterning of an electron-sensitive resist layer may be by way of electron beam exposure (electron beam lithography, i.e., e-beam lithography). The skilled artisan will appreciate that the foregoing are merely illustrative examples.

At 918, the isolated trenches 176 are filled with an isolated material, such as a porous insulated material (e.g., oxide, polyamide, etc.), a composite material, or the like. The isolated material may be deposited by, for example, chemical vapor deposition (CVD), physical vapor deposition (PVD), atomic layer deposition (ALD), electroless plating, electrochemical plating, sputtering, ion metal plasma, another deposition process, or any suitable combination thereof.

At 920, the integrated MEMS component 102/analog circuit component 104 is bonded to the HPC component 106, thereby forming an integrated MEMS component 102/analog circuit component 104/HPC component 106. That is, the bottom of the analog circuit component 104 is bonded to the top of the HPC component 106. Suitable bonding methodologies include, for example and without limitation, fusion bonding, eutectic bonding, hybrid bonding, or the like. At 922, the integrated MEMS component 102/analog circuit component 104/HPC component 106 is bonded to the DTC component 108, thereby forming an integrated MEMS component 102/analog circuit component 104/HPC component 106/DTC component 108. That is, the bottom of the HPC component 106 is bonded to the top of the DTC component 108. At 924, the integrated MEMS component 102/analog circuit component 104/HPC component 106/DTC component 108 is bonded to the circuit board component 110 to complete formation of a semiconductor device 100 in accordance with some embodiments contemplated herein. At 924, the bottom of the DTC component 108 is bonded (e.g., attached) to the top of the circuit board component 110, e.g., using the solder balls 153 to electrically connect the printed circuit board 152 to the DTC component TSVs 172-174. It will be appreciated that the foregoing processing, occurring at the wafer level, may subsequently be sent for packaging, i.e., dicing the wafer into individual MEMS arrays. Thereafter, assembly into various articles of manufacture that utilize such MEMS arrays, i.e., fingerprint scanners, ultrasound devices, etc., may occur.

Figure 10:
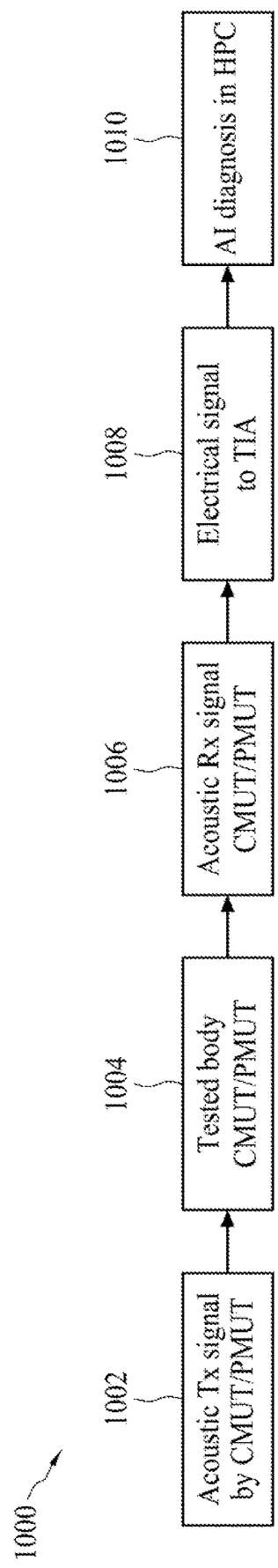
FIG. 10 is an example operation of a semiconductor device in accordance with some embodiments.

Turning now to FIG. 10, there is shown a functional block diagram 1000 of one example operation of the semiconductor device 100 described above. As shown in FIG. 10, an acoustic signal is transmitted by the MEMS component 102 of the semiconductor device 100 at 1002. In the embodiment of FIG. 10, the MEMS component 102 may be implemented as a CMUT array, a PMUT array, or the like. For example, as illustrated in FIG. 11, the semiconductor device 100 may be disposed within a handheld ultrasound wand 1100, that includes the semiconductor device 100, wand body 1102, and rubber barrier 1104. As illustrated in FIG. 11, the ultrasound wand 1100 is placed in contact with skin 1108, with a dielectric grease 1106 positioned between the rubber barrier 1104 and skin 1108. At 1004, the acoustic signal then penetrates the skin 1108. At 1006, the acoustic signal returning from within the skin 1108 is received by MEMS component 102 and translated into an electric signal. This electric signal is then transmitted to the analog circuit component 104, e.g., to a transimpedance amplifier at 1008 and thereafter converted into a digital signal that is communicated to the HPC component 106. At 1010, the HPC component 106 processes the signal (e.g., artificial intelligence, DSP, etc.) and outputs the results of such processing to a designated output terminal (not shown) such as, for example and without limitation, a video monitor, a portable electronic device (e.g., tablet, laptop, mobile phone, etc.), a remote computer (e.g., via wireless or wired communications), or the like.

In accordance with a first embodiment, there is provided a method of forming a semiconductor device. The method includes processing an analog circuit component to reduce the thickness of an analog circuit component substrate, and processing a high performance chip (HPC) component to reduce the thickness of an HPC component substrate. The method further includes forming at least one through-silicon via (TSV) cavity in the analog circuit component, the HPC component, and the deep trench capacitor (DTC) component. Additionally, the method includes forming a TSV electrical connection on each of the analog circuit component, the HPC component, and the DTC component in the at least one TSV cavity, and bonding a microelectromechanical system (MEMS) membrane substrate of a MEMS component to a top of the analog circuit component to form an integrated MEMS component/analog circuit component. The method further includes bonding the bottom of the analog circuit component of the integrated MEMS component/analog circuit component to the top of the HPC component to form an integrated MEMS component/analog circuit component/HPC component, and bonding the bottom of the HPC component of the integrated MEMS component/analog circuit component/HPC component to the top of the DTC component to form an integrated MEMS component/analog circuit component/HPC component/DTC component. The method also includes bonding the bottom of the DTC component of the integrated MEMS component/analog circuit component/HPC component/DTC component to the top of a circuit board component.

In accordance with a second embodiment, there is provided a semiconductor device that includes a MEMS component that has a MEMS membrane substrate and a MEMS sidewall, such that the MEMS component includes a plurality of MEMS pixels. The semiconductor device also includes an analog circuit component that is bonded to the MEMS component, and which includes at least one analog CMOS component within an analog circuit insulative layer, and an analog circuit component substrate. The semiconductor device further includes an HPC component that is bonded to the analog circuit component substrate. The HPC component includes at least one HPC metal component disposed within an HPC insulative layer, at least one bond pad, at least one bond pad via connecting the at least one bond pad and the at least one HPC metal component, and an HPC substrate. In addition, the semiconductor device includes a DTC component that is bonded to the HPC substrate. The DTC component includes at least one DTC die disposed in a DTC carrier substrate.

In accordance with a third embodiment, there is provided a method of forming a semiconductor device that includes fabricating a MEMS component, an analog circuit component, an HPC component, and a DTC component. The method also includes bonding a microelectromechanical system (MEMS) membrane substrate of the MEMS component to a top of the analog circuit component to form an integrated MEMS component/analog circuit component, and bonding a bottom of the analog circuit component of the integrated MEMS component/analog circuit component to a top of the HPC component to form an integrated MEMS component/analog circuit component/HPC component. The method further includes bonding a bottom of the HPC component of the integrated MEMS component/analog circuit component/HPC component to a top of the DTC component to form an integrated MEMS component/analog circuit component/HPC component/DTC component. Furthermore, the method includes bonding a bottom of the DTC component of the integrated MEMS component/analog circuit component/HPC component/DTC component to a top of a circuit board component.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
   processing an analog circuit component to reduce a thickness of an analog circuit component substrate;
   processing a high performance chip (HPC) component to reduce a thickness of an HPC component substrate;
   forming at least one through-silicon via (TSV) cavity in the analog circuit component, the HPC component, and a deep trench capacitor (DTC) component;
   forming, in the at least one TSV cavity, a TSV electrical connection on each of the analog circuit component, the HPC component, and the DTC component;
   bonding a microelectromechanical system (MEMS) membrane substrate of a MEMS component to a top of the analog circuit component to form an integrated MEMS component/analog circuit component;
   bonding a bottom of the analog circuit component of the integrated MEMS component/analog circuit component to a top of the HPC component to form an integrated MEMS component/analog circuit component/HPC component;
   bonding a bottom of the HPC component of the integrated MEMS component/analog circuit component/HPC component to a top of the DTC component to form an integrated MEMS component/analog circuit component/HPC component/DTC component; and
   bonding a bottom of the DTC component of the integrated MEMS component/analog circuit component/HPC component/DTC component to a top of a circuit board component.

2. The method of claim 1, further comprising:
   processing the MEMS membrane substrate to reduce a thickness thereof;

patterning at least one isolated trench on the MEMS membrane substrate; and filling the at least one isolated trench on the MEMS membrane substrate with an isolating material.

3. The method of claim 2, wherein the MEMS component comprises at least one of a capacitive micromachined ultrasonic transducer or a piezoelectric micromachined ultrasonic transducer.

4. The method of claim 1, further comprising forming at least one cascaded seal ring in the MEMS component.

5. The method of claim 1, wherein the bonding of the MEMS component to the analog circuit component is performed by fusion bonding, eutectic bonding, or hybrid bonding.

6. The method of claim 1, wherein the bonding of the integrated MEMS component/analog circuit component to the HPC component is performed by fusion bonding, eutectic bonding, or hybrid bonding.

7. The method of claim 1, wherein the bonding of the integrated MEMS component/analog circuit component/ HPC component to the DTC component is performed by fusion bonding, eutectic bonding, or hybrid bonding.

8. The method of claim 1, wherein forming the at least one TSV cavity further comprises:

forming an analog component TSV cavity on the analog circuit component;

forming a first HPC component TSV cavity and a second HPC component TSV cavity on the HPC component; and forming a first DTC component TSV cavity and a second DTC component TSV cavity on the DTC component.

9. The method of claim 8, further comprising:

forming an analog circuit component TSV in the analog circuit component TSV cavity;

forming a first HPC component TSV in the first HPC component TSV cavity and a second HPC component TSV in the second HPC component TSV cavity on the HPC component; and forming a first DTC component TSV in the first DTC component TSV cavity and a second DTC component TSV in the second DTC component TSV cavity on the DTC component, wherein the analog circuit component TSV is in contact with an HPC metal component of the HPC component, the first HPC component TSV is in contact with the first DTC component TSV, the second HPC component is in contact with at least one DTC on the DTC component, and the first DTC component TSV and the second DTC component TSV are in contact with the circuit board component.

10. A method of forming a semiconductor device, comprising:

fabricating a microelectromechanical system (MEMS) component, an analog circuit component, a high performance chip (HPC) component, and a deep trench capacitor (DTC) component;

bonding a MEMS membrane substrate of the MEMS component to a top of the analog circuit component to form an integrated MEMS component/analog circuit component;

bonding a bottom of the analog circuit component of the integrated MEMS component/analog circuit component to a top of the HPC component to form an integrated MEMS component/analog circuit component/HPC component;

bonding a bottom of the HPC component of the integrated MEMS component/analog circuit component/HPC component to a top of the DTC component to form an integrated MEMS component/analog circuit component/HPC component/DTC component; and bonding a bottom of the DTC component of the integrated MEMS component/analog circuit component/HPC component/DTC component to a top of a circuit board component.

11. The method of claim 10, further comprising forming at least one cascaded seal ring in the MEMS component.

12. The method of claim 11, further comprising:

processing the MEMS membrane substrate to reduce a thickness thereof;

patterning at least one isolated trench on the MEMS membrane substrate; and filling the at least one isolated trench on the MEMS membrane substrate with an isolating material.

13. A method of forming a semiconductor device, comprising:

forming a microelectromechanical system (MEMS) component comprising a MEMS membrane substrate and a MEMS sidewall, the MEMS component including a plurality of MEMS pixels;

forming an analog circuit component bonded to the MEMS component, the analog circuit component comprising at least one analog complementary metal oxide (CMOS) component within an analog circuit insulative layer, and an analog circuit component substrate;

bonding a high performance chip (HPC) component to the analog circuit component substrate, the HPC component comprising at least one HPC metal component disposed within an HPC insulative layer, at least one bond pad, at least one bond pad via connecting the at least one bond pad and the at least one HPC metal component, and an HPC substrate; and bonding a deep trench capacitor (DTC) component to the HPC substrate, the DTC component comprising at least one DTC die disposed in a DTC carrier substrate.

14. The method of claim 13, further comprising disposing at least one cascaded seal ring in the MEMS component to provide shielding for noise between adjoining MEMS pixels.

15. The method of claim 14, wherein forming the analog circuit component further comprises forming at least one analog component through-silicon via (TSV) in contact with the at least one analog CMOS component and positioned in the analog circuit substrate.

16. The method of claim 15, further comprising: forming the at least one analog component TSV in contact with the at least one bond pad of the HPC component.

17. The method of claim 16, wherein forming the HPC component further comprises forming a first HPC component TSV in contact with the at least one HPC metal component and forming a second HPC component TSV disposed in the HPC substrate.

18. The method of claim 17, wherein the DTC component further comprises a first DTC component TSV disposed in the DTC carrier substrate, and a second DTC component TSV in contact with the at least one DTC die.

19. The method of claim 18, wherein the MEMS membrane substrate further comprises at least one isolated trench positioned between adjoining MEMS pixels.

20. The method of claim 19, wherein the at least one isolated trench includes an isolation material, the isolation material providing mechanical interference shielding between the adjoining MEMS pixels.

* * * * *